United States Patent
Ootaka et al.

(10) Patent No.: US 9,112,034 B2
(45) Date of Patent: Aug. 18, 2015

(54) THIN-FILM SEMICONDUCTOR DEVICE AND METHOD OF MANUFACTURING THE SAME

(71) Applicants: PANASONIC CORPORATION, Osaka (JP); PANASONIC LIQUID CRYSTAL DISPLAY CO., LTD., Hyogo (JP)

(72) Inventors: Sei Ootaka, Hyogo (JP); Hiroshi Yoshioka, Chiba (JP); Takahiro Kawashima, Osaka (JP); Hikaru Nishitani, Hyogo (JP)

(73) Assignees: PANASONIC LIQUID CRYSTAL DISPLAY CO., LTD., Hyogo (JP); JOLED INC., Tokyo (JP)

( * ) Notice: Subject to any disclaimer, the term of this patent is extended or adjusted under 35 U.S.C. 154(b) by 0 days.

(21) Appl. No.: 13/918,011

(22) Filed: Jun. 14, 2013

(65) Prior Publication Data

US 2013/0277678 A1 Oct. 24, 2013

(30) Foreign Application Priority Data

Oct. 25, 2011 (JP) .................... 2011-234398

(51) Int. Cl.
*H01L 29/04* (2006.01)
*H01L 29/10* (2006.01)
(Continued)

(52) U.S. Cl.
CPC ...... *H01L 29/78678* (2013.01); *H01L 27/1285* (2013.01); *H01L 29/66765* (2013.01);
(Continued)

(58) Field of Classification Search
CPC .................. H01L 29/78603; H01L 29/78648; H01L 29/78654
USPC ............................... 438/166, 486; 257/57, 66
See application file for complete search history.

(56) References Cited

U.S. PATENT DOCUMENTS 6,743,700 B2  6/2004 Asami et al.
7,384,828 B2  6/2008 Asami et al.
(Continued)

FOREIGN PATENT DOCUMENTS

EP  0 473 988  3/1992
JP  05-243575  9/1993
(Continued)

OTHER PUBLICATIONS

International Search Report (ISR) in International Patent Application No. PCT/JP2012/006699, dated Dec. 25, 2012.
(Continued)

*Primary Examiner* — Zandra Smith
*Assistant Examiner* — John M Parker
(74) *Attorney, Agent, or Firm* — Greenblum & Bernstein, P.L.C.

(57) ABSTRACT

A thin-film semiconductor device manufacturing method according to the present disclosure includes: preparing a substrate; forming a gate electrode above the substrate; forming a gate insulating film above the substrate; forming an amorphous film (amorphous silicon film) above the substrate; forming a crystalline film (crystalline silicon film) including a first crystal and a second crystal, by crystallizing the amorphous film, the first crystal (i) containing subgrains formed with different crystal orientations in a single crystal and (ii) including a subgrain boundary formed by plural crystal planes between the subgrains, the second crystal having an average crystal grain size smaller than an average crystal grain size of the first crystal; thinning the crystalline film; and forming a source electrode and a drain electrode above the substrate.

21 Claims, 23 Drawing Sheets

(51) Int. Cl.
*H01L 31/00* (2006.01)
*H01L 29/786* (2006.01)
*H01L 29/66* (2006.01)
*H01L 27/12* (2006.01)

(52) U.S. Cl.
CPC ..... *H01L29/78669* (2013.01); *H01L 29/78603* (2013.01); *H01L 29/78648* (2013.01); *H01L 29/78654* (2013.01)

(56) References Cited

U.S. PATENT DOCUMENTS

| | | | |
|---|---|---|---|
| 8,284,369 B2* | 10/2012 | Chida et al. | 349/149 |
| 8,377,723 B2 | 2/2013 | Nagai et al. | |
| 8,421,080 B2 | 4/2013 | Saitoh et al. | |
| 2002/0182828 A1 | 12/2002 | Asami et al. | |
| 2005/0020037 A1 | 1/2005 | Asami et al. | |
| 2009/0321737 A1* | 12/2009 | Isa et al. | 257/57 |
| 2011/0297950 A1* | 12/2011 | Kato et al. | 257/66 |
| 2011/0318891 A1 | 12/2011 | Oda et al. | |
| 2012/0256538 A1 | 10/2012 | Takeuchi et al. | |
| 2013/0026479 A1 | 1/2013 | Kawashima et al. | |
| 2013/0026749 A1* | 1/2013 | O'Brien et al. | 285/62 |

FOREIGN PATENT DOCUMENTS

| | | |
|---|---|---|
| JP | 06-342909 | 12/1994 |
| JP | 10-106951 | 4/1998 |
| JP | 2001-007024 | 1/2001 |
| JP | 2007-173839 | 7/2007 |
| JP | 2008-166828 | 7/2008 |
| JP | 2010-199529 | 9/2010 |
| WO | 2012/127769 | 9/2012 |

OTHER PUBLICATIONS

Naoto Matsuo et al., "Influence of Laser Plasma Soft X-Ray Irradiation on Crystallization of a-Si Film by Infrared Furnace Annealing", The Japan Institute of Metals, Materials Transactions, vol. 51, No. 8, pp. 1490-1493, Jul. 14, 2010.

Yoko Iwakaji et al., "Low-temperature crystallization of thin-film amorphous silicon", The Institute of Electronics, Information and Communication Engineers, Technical Report of IEICE. SDM, vol. 110, No. 241, pp. 31-34, Oct. 14, 2010.

* cited by examiner (SEM image)

FIG. 4

|  | Present disclosure | Short-time SPC | Long-time SPC | High-temperature polysilicon | Molten polysilicon | Explosive |
|---|---|---|---|---|---|---|
| Crystal growth mechanism | Solid phase crystallization + sintered bonding | Solid phase crystallization | Solid phase crystallization | Melting | Melting | Partial melting |
| Grain size | 0.2 $\mu$m - 2 $\mu$m<br>20 nm - 50 nm<br>2-type mixed distribution<br>2 distributions | 10 nm - 30 nm | 1 $\mu$m - 5 $\mu$m | 350 nm - 500 nm | 0.5 $\mu$m - 5 $\mu$m | 0.5 $\mu$m - 1 $\mu$m<br>50 nm - 200 nm<br>2-type mixed distribution<br>2 distributions |
| Crystallinity (Raman crystallization rate) | Intermediate number of amorphous components (70%) | Many amorphous components (40%) | Many amorphous components (No data) | Few amorphous components (No data) | Few amorphous components (At least 95%) | Intermediate number of amorphous components (60%) |
| Grain shape | Irregular, complex | Spherical | Needle-like crystals crossing | Horizontal plane growth polygon | Horizontal plane growth polygon | Partially-horizontal plane growth polygon |
| Crystal | Polycrystalline (with subgrain) | Almost monocrystalline | Almost monocrystalline | Almost monocrystalline | Almost monocrystalline | Almost monocrystalline |
| Orientation | None (irregular) | None (irregular) | Oriented in needle-shape direction | | Oriented (111) | Partially oriented (111) |
| Intragranular defect (EBSP) | There are parts where crystal orientation differs in a curve | Twin<br>Linear form | Twin<br>Linear form | Twin<br>Linear form | Twin<br>Linear form | Twin<br>Linear form |
| Surface | Without protrusions | Without protrusions | Without protrusions | Without protrusions | With grain boundary protrusions (approximately as high as film thickness) | With grain boundary protrusions (approximately as high as film thickness) |
| Flatness of grains not less than 200 nm in grain size | Undulating | Flat | Flat | Flat | Flat | Flat |
| Grain boundaries | Curved | | Straight Corresponding to needle-like crystal | Mainly straight Polygon | Mainly straight Polygon | With straight parts and curved parts |
| Process | Annealing 700 °C - 800 °C 1 - 30 mins. | Annealing 650 °C - several mins. Or LA low energy density | Annealing 600 °C 5 - 20 hrs. | Annealing 900 °C - 1100 °C e.g. at least 30 mins. | LA high energy density | LA intermediate energy density |
| TFT mobility | Up to 10 (30) | 0.5 - 3 | | 20 - 200 | 20 - 200 | 5 - 20 |

FIG. 5A
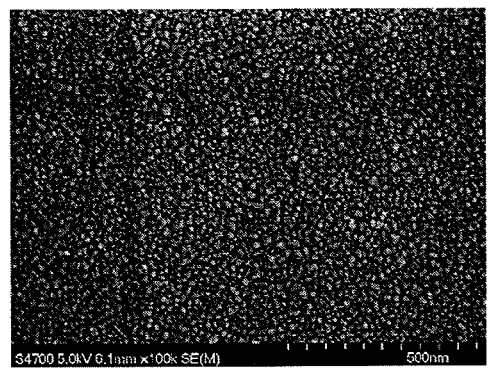 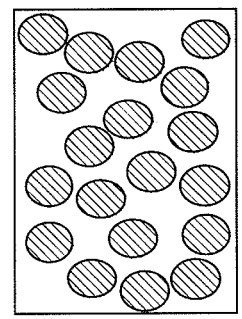
(SEM image)　　(Schematic diagram)
FIG. 5B
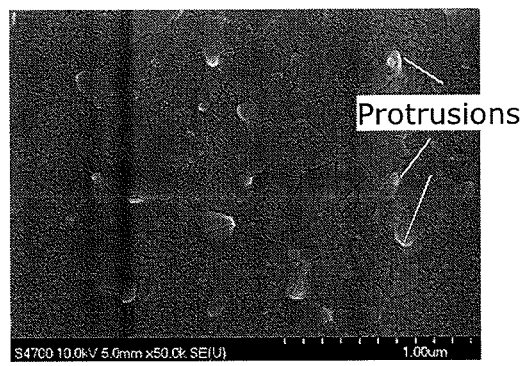 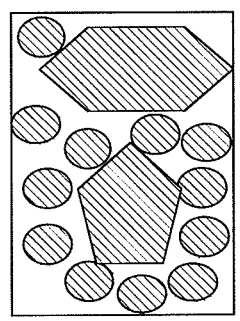
(SEM image)　　(Schematic diagram)
FIG. 5C
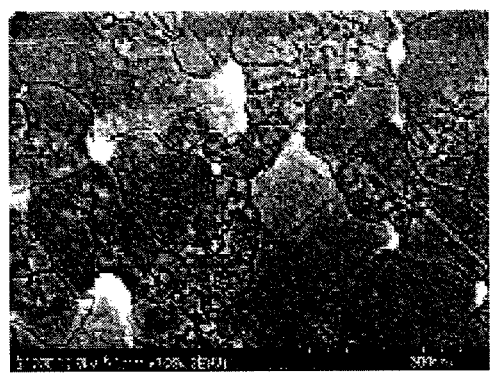 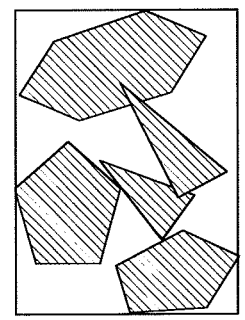
(SEM image)　　(Schematic diagram)

(SiH$_4$/Ar 70nm 750°C)

(LTPS)

(SiH$_4$/Ar 70nm 750°C)

|  | Condition 1 | Condition 2 | Condition 3 | Ref |
|---|---|---|---|---|
| Growth temperature (°C) | 400 | 400 | 400 | 340 |
| Diluent gas | Hydrogen | None | Argon | Hydrogen |
| Pressure (Torr) | 2 | 2 | 5 | 2 |
| RF power density (W/cm$^2$) | 0.28 | 0.28 | 0.28 | 0.05 |

THIN-FILM SEMICONDUCTOR DEVICE AND METHOD OF MANUFACTURING THE SAME

CROSS REFERENCE TO RELATED APPLICATION

This is a continuation application of PCT International Application No. PCT/JP2012/006699 filed on Oct. 19, 2012, designating the United States of America, which is based on and claims priority of Japanese Patent Application No. 2011-234398 filed on Oct. 25, 2011. The entire disclosures of the above-identified applications, including the specifications, drawings and claims are incorporated herein by reference in their entirety.

FIELD

One or more exemplary embodiments disclosed herein relate generally to thin-film semiconductor devices and methods of manufacturing the same, and relate particularly to a thin-film transistor device used in a thin-screen display device such as a liquid crystal display device, an organic electroluminescence (EL) display device, or the like, and to a method of manufacturing the same.

BACKGROUND

A semiconductor layer (channel layer) which is to become a channel portion of a thin-film transistor (hereafter referred to as "TFT") used in liquid-crystal display devices or organic EL display devices is made of, for example, an amorphous silicon film or a crystalline silicon film (see, for example, Patent Literature (PTL) 1). Here, for example, the semiconductor layer which is to become the channel portion is formed from a crystalline silicon film capable of realizing a TFT having high mobility, compared to an amorphous silicon film. This is because, a high-mobility TFT having a crystalline silicon film as a channel portion can also be used in a high-definition display device in which the size of the TFT is reduced, in addition to the raising of switching speed. As such, in order to manufacture a TFT having a crystalline silicon film as a channel portion, a crystalline silicon film is obtained by forming an amorphous silicon film and subsequently crystallizing the amorphous silicon film, in the manufacturing process.

Well-known methods of crystallizing an amorphous silicon film include, for example, a laser annealing crystallization method, a thermal annealing crystallization method, and so on.

CITATION LIST

Patent Literature

[PTL 1] Japanese Unexamined Patent Application Publication No. 6-342909

SUMMARY

Technical Problem

Although the laser annealing crystallization method makes it possible to obtain a crystalline silicon film having crystals with a large grain size, the unevenness in grain size between crystal grains in the film tends to become relatively large, and thus there is a tendency for increased unevenness in TFT electrical characteristics such as mobility and off-current.

Furthermore, although the thermal annealing crystallization method enables the forming of a crystalline silicon film by, for example, thermal annealing inside a heat-treating furnace, prolonged thermal annealing spanning several tens of hours is required in order to obtain crystals having a large grain size of about several μms. As such, an extremely long time is required in order to obtain crystals having a large grain size. It is difficult to obtain high mobility for a TFT having, as the channel portion, such a crystalline silicon film with a grain size of several tens of nms because the crystal grain size is relatively small.

In this manner, in the conventional method of crystallizing an amorphous silicon film, it is difficult to achieve both high mobility and suppressed unevenness in electrical characteristics.

Solution to Problem

In one general aspect, the techniques disclosed here feature a thin-film semiconductor device manufacturing method which includes: preparing a substrate; forming a gate electrode above the substrate; forming a gate insulating film above the substrate; forming an amorphous film above the substrate; forming a crystalline film including a first crystal and a second crystal, by crystallizing the amorphous film, the first crystal (i) containing subgrains formed with different crystal orientations in a single crystal and (ii) including a subgrain boundary formed by plural crystal planes between the subgrains, the second crystal having an average crystal grain size smaller than an average crystal grain size of the first crystal; thinning the crystalline film; and forming a source electrode and a drain electrode above the substrate.

Additional benefits and advantages of the disclosed embodiment will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

The crystalline film includes a first crystal (i) containing subgrains formed with different crystal orientations in a single crystal and (ii) including subgrain boundaries formed between the subgrains by plural crystal faces. Accordingly, it is possible to realize a thin-film semiconductor device having characteristics such as relatively high mobility and low electrical characteristic unevenness. Furthermore, by thinning the crystalline film, the percentage of the first crystals in the upper surface of the crystalline film becomes higher than the percentage of the first crystals in the lower surface of the crystalline film.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 4 is a table compiling the characteristics of the crystalline silicon film according to the exemplary embodiment and conventional crystalline silicon films.

FIG. 5A shows a planar SEM image of a crystalline silicon film having an SPC morphology obtained by LA crystallization with low energy density, and a schematic diagram thereof.

FIG. 5B shows a planar SEM image of a crystalline silicon film having an explosive morphology obtained by LA crystallization with intermediate energy density, and a schematic diagram thereof.

FIG. 5C shows a planar SEM image of a crystalline silicon film having a molten polysilicon morphology obtained by LA crystallization with high energy density, and a schematic diagram thereof.

DESCRIPTION OF EMBODIMENTS

Figure 1A:
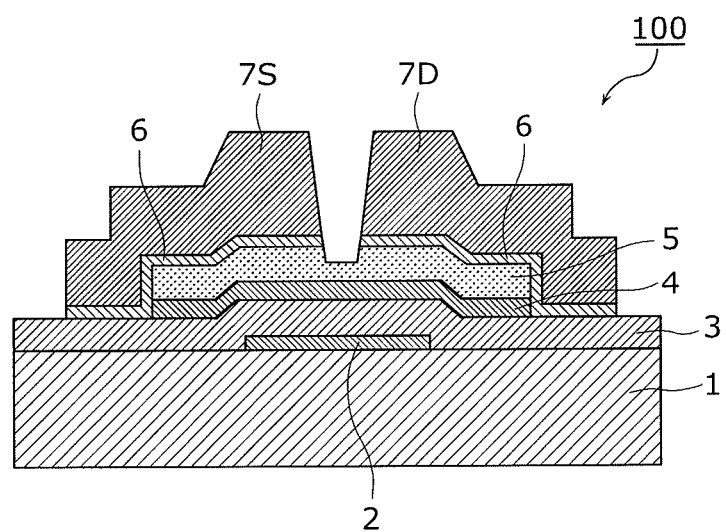
FIG. 1A is a cross-sectional view for schematically showing a configuration of a thin-film semiconductor device according to an exemplary embodiment.

A thin-film semiconductor device manufacturing method according to an aspect of the present disclosure includes: preparing a substrate; forming a gate electrode above the substrate; forming a gate insulating film above the substrate; forming an amorphous film above the substrate; forming a crystalline film including a first crystal and a second crystal, by crystallizing the amorphous film, the first crystal (i) containing subgrains formed with different crystal orientations in a single crystal and (ii) including a subgrain boundary formed by plural crystal planes between the subgrains, the second crystal having an average crystal grain size smaller than an average crystal grain size of the first crystal; thinning the crystalline film; and forming a source electrode and a drain electrode above the substrate.

According to this aspect, the crystalline film includes a first crystal (i) containing subgrains formed with different crystal orientations in a single crystal and (ii) including subgrain boundaries formed between the subgrains by plural crystal faces. With this, a TFT having relatively high mobility can be realized. Furthermore, since the crystalline film is thinned, it is possible to reduce the number of crystal grain boundaries in a region in the film-thickness direction in the carrier conduction path. With this, a thin-film semiconductor device having low electrical characteristic unevenness can be realized. In addition, by thinning the crystalline film, the percentage of the first crystal in the upper surface of the crystalline film becomes higher than the percentage of the first crystal in the lower surface of the crystalline film, and thus, in the thin-film semiconductor device, the contact resistance with an overlying layer can be reduced.

Furthermore, in a thin-film semiconductor device manufacturing method according to an aspect of the present disclosure, the amorphous film may be an amorphous silicon film.

With this, a thin-film semiconductor device including a polycrystalline silicon film can be realized.

Furthermore, in a thin-film semiconductor device manufacturing method according to an aspect of the present disclosure, the amorphous silicon film may have a photoluminescence (PL) intensity greater than or equal to 0.65 when photon energy is 1.1 eV in a PL spectrum normalized to have a maximum PL intensity of 1.

Accordingly, since it is possible to form a region (pseudocrystal nucleus) in which the density of bonds between Si atom and Si atom is high locally in the amorphous silicon film which is the precursor film of the crystalline silicon film, the activation energy of crystallization in the crystallization annealing can be reduced, and it is possible to lower the temperature (increase the grain size compared to the grain size at the same crystallization temperature in the conventional method). Therefore, the grain size of the crystalline silicon film formed according to this aspect can be made bigger than the grain size of the crystalline silicon film that has undergone the same crystallization annealing as in the conventional method. Therefore, by manufacturing a TFT having, as a channel layer, the crystalline silicon film formed according to this aspect, it is possible to improve on-state current.

Furthermore, in a thin-film semiconductor device manufacturing method according to an aspect of the present disclosure, in the forming of the crystalline film, the amorphous film may be crystallized by thermal annealing.

With this, crystal grain size in the sintered morphology can be controlled easily using the thermal annealing time.

Furthermore, in a thin-film semiconductor device manufacturing method according to an aspect of the present disclosure, the thermal annealing may be performed with a thermal annealing temperature ranging from 700° C. to 800° C. and a thermal annealing time ranging from 1 minute to 30 minutes.

With this, a glass substrate can be used as the substrate.

Furthermore, in a thin-film semiconductor device manufacturing method according to an aspect of the present disclosure, in the thinning, the crystalline film may be thinned by etching.

With this, the crystalline film can be easily etched.

Furthermore, in a thin-film semiconductor device manufacturing method according to an aspect of the present disclosure, the etching may be hydrofluoric acid etching.

With this, the crystalline film can be etched without inflicting charge damage.

Furthermore, a thin-film semiconductor device manufacturing method according to an aspect of the present disclosure, may further include oxidizing an upper surface of the crystalline film before the thinning, wherein in the thinning, an oxidized upper portion of the crystalline film may be removed by the etching.

With this, the amount of thickness to be etched within the substrate surface can be made uniform, and thus electrical characteristic unevenness can be suppressed.

Furthermore, in a thin-film semiconductor device manufacturing method according to an aspect of the present disclosure, the oxidizing may be performed by ozone oxidation.

With this, the upper surface of the crystalline film can be uniformly oxidized easily.

Furthermore, in a thin-film semiconductor device manufacturing method according to an aspect of the present disclosure, the crystalline film before the thinning may have a thickness of at least 55 nm, and the crystalline film after the thinning may have a thickness ranging from 20 nm to 50 nm.

Furthermore, in a thin-film semiconductor device manufacturing method according to an aspect of the present disclosure, the first crystal may consist of a crystal grain having an average crystal grain size ranging from 200 nm to 2 µm, and the second crystal may consist of a crystal grain having an average crystal grain size ranging from 20 nm to 50 nm.

Furthermore, a thin-film semiconductor device according to an aspect of the present disclosure includes a substrate; a gate electrode above the substrate; a crystalline film above the substrate; a gate insulating film between the gate electrode and the crystalline film; a source electrode and a drain electrode which are above the substrate, wherein the crystalline film includes a first crystal and a second crystal, the first crystal (i) containing subgrains formed with different crystal orientations in a single crystal and (ii) including a subgrain boundary formed by plural crystal planes between the subgrains, the second crystal having an average crystal grain size smaller than an average crystal grain size of the first crystal, and a percentage of the first crystal in an upper surface of the crystalline film is higher than a percentage of the first crystal in a lower surface of the crystalline film.

According to this aspect, since the crystalline film includes a first crystal formed by sintering and having a large crystal grain size, a thin-film semiconductor device having high mobility can be realized. Furthermore, since the percentage of the first crystal in the upper surface of the crystalline film is higher than the percentage of the first crystal in the lower surface of the crystalline film, it is possible to reduce the number of crystal grain boundaries in a region in the film-thickness direction in the carrier conduction path. Therefore, unevenness in electrical characteristics can be reduced.

Furthermore, in a thin-film semiconductor device according to an aspect of the present disclosure, the second crystal may be a single-grained structure.

When the second crystal is (or has) a single-grained structure, that is, has a monocrystal structure, the crystal orientation of the first crystal becomes easy to control due to the influence of such single-grained crystal orientation. With this, the second crystal is already a polycrystal, the crystal orientation of the first crystal becomes difficult to control due to the influence of plural crystal orientations.

Furthermore, in a thin-film semiconductor device according to an aspect of the present disclosure, the crystalline film can be formed by thinning a precursor film which includes the first crystal and the second crystal.

According to this aspect, since the crystalline film is formed by thinning the precursor film having the sintered morphology, it is possible to reduce the number of crystal grain boundaries in a region in the film-thickness direction in the carrier conduction path. With this, electrical characteristic unevenness can be reduced.

Furthermore, for example, in a thin-film semiconductor device according to an aspect of the present disclosure, the precursor film has a thickness of at least 55 nm, and the crystalline film has a thickness ranging from 20 nm to 50 nm.

Furthermore, for example, in a thin-film semiconductor device manufacturing method according to an aspect of the present disclosure, the first crystal may consist of a crystal grain having an average crystal grain size ranging from 200 nm to 2 μm, and the second crystal may consist of a crystal grain having an average crystal grain size ranging from 20 nm to 50 nm.

Furthermore, in a thin-film semiconductor device according to an aspect of the present disclosure, a percentage content of the first crystal included in the crystalline film can be higher towards the source electrode and the drain electrode than towards the gate insulating film, in a thickness direction of the crystalline film.

Furthermore, in a thin-film semiconductor device according to an aspect of the present disclosure, the crystalline film can be formed by thinning a precursor film which includes the first crystal and the second crystal.

Hereinafter, a certain exemplary embodiment is described in greater detail with reference to the accompanying Drawings.

The exemplary embodiment described below shows a general or specific example. The numerical values, shapes, materials, structural elements, the arrangement and connection of the structural elements, steps, the processing order of the steps etc. shown in the following exemplary embodiment are mere examples, and therefore do not limit the scope of the appended Claims and their equivalents. Therefore, among the structural elements in the following exemplary embodiment, structural elements not recited in any one of the independent claims are described as arbitrary structural elements.

Embodiment

Hereinafter, a thin-film semiconductor device and a method of manufacturing the same according to an exemplary embodiment shall be described with reference to the Drawings. It should be noted that the exemplary embodiment described below shows one specific example. Thus, the numerical values, shapes, materials, structural elements, the arrangement and connection of the structural elements, steps, the processing order of the steps etc. shown in the following exemplary embodiment is a mere example, and therefore does not limit the scope of the appended Claims and their equivalents. Therefore, among the structural elements in the following exemplary embodiment, structural elements not recited in any one of the claims are described as arbitrary structural elements. Furthermore, in the respective figures, elements having substantially the same configuration, operation, and effect are given the same reference sign.

Figure 1B:
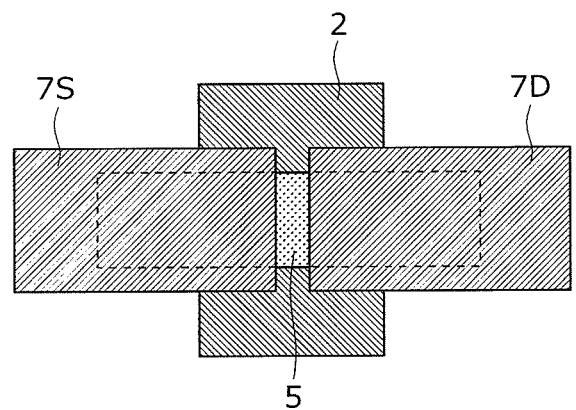
FIG. 1B is a plan view for schematically showing the configuration of the thin-film semiconductor device according to the exemplary embodiment.

First, a thin-film semiconductor device 100 according to the exemplary embodiment shall be described using FIG. 1A and FIG. 1B. FIG. 1A is a cross-sectional view that schematically shows a configuration of the thin-film semiconductor device 100 according to the exemplary embodiment, and FIG. 1B is a plan view of the thin-film semiconductor device 100.

A thin-film semiconductor device according to an aspect of the present disclosure includes a substrate as well as a gate electrode, a gate insulating film, a crystalline silicon film, a source electrode, and a drain electrode which are formed above the substrate. As shown in FIG. 1A and FIG. 1B, the thin-film semiconductor device 100 according to the exemplary embodiment is a channel etching, bottom-gate thin-film transistor, and includes a substrate 1, as well as a gate electrode 2, a gate insulating film 3, a crystalline silicon film 4, an amorphous silicon film 5, a pair of contact layers 6, and a pair of a source electrode 7S and a drain electrode 7D, which are sequentially formed above the substrate 1. The respective structural elements of the thin-film semiconductor device 100 according to the exemplary embodiment shall be described in detail below.

For the substrate 1, it is possible to use, for example, a glass substrate made of a glass material such as quartz glass, alkali-free glass, highly heat-resistant glass, and so on. It should be noted that, in order to prevent impurities such as natrium and phosphorus included in the glass substrate from entering the crystalline silicon film 4 which is to become the channel portion, an undercoat layer made of a silicon nitride ($SiN_X$), a silicon oxide ($SiO_Y$), a silicon oxynitride film ($SiO_YN_X$), or the like, may be formed on the upper surface of the substrate 1. Furthermore, the undercoat layer also serves to alleviate the effects of heat on the substrate 1 during high-temperature thermal processing. The thickness of the undercoat film can be set to, for example, approximately 100 to 2000 nm.

The gate electrode 2 is formed in a predetermined shape, above the substrate 1. The gate electrode 2 is configured of a single-layer structure or a multi-layer structure of a conductive material or an alloy thereof, and so on, that can resist the melting-point temperature of silicon, and it is possible to use, for example, molybdenum (Mo), aluminum (Al), copper (Cu), tungsten (W), tantalum (Ta), niobium (Nb), nickel (Ni), titanium (Ti), chromium (Cr), molybdenum-tungsten (MoW), and so on. The gate electrode 2 is formed by forming a gate metal film made of such materials above the substrate 1, and patterning the gate metal film into the predetermined shape. It should be noted that the thickness of the gate electrode 2 can be set to, for example, approximately 20 to 500 nm.

The gate insulating film 3 is formed above the substrate 1 and the gate electrode 2 to cover the gate electrode 2. The gate insulating film 3 can be formed using, for example, a silicon oxide, a silicon nitride, a silicon oxynitride, an aluminum oxide ($AlO_Z$), a tantalum oxide ($TaO_W$), or a layered film thereof.

In the exemplary embodiment, for example, a silicon dioxide film is used as the gate insulating film 3 because the crystalline silicon film 4 is used as the channel portion. This is because it is good to have a good interface between the channel portion and the gate insulating film 3 in order to maintain good threshold voltage characteristics in the TFT, and a silicon dioxide film is suitable for this. It should be noted that the thickness of the gate insulating film 3 can be set to, for example, approximately 50 to 300 nm.

The crystalline silicon film 4 is a crystalline film which functions as a channel portion (channel layer) in the thin-film semiconductor device 100, and has a channel region which is a region in which the movement of carriers is controlled according to the voltage of the gate electrode 2. In the exemplary embodiment, the crystalline silicon film 4 has a crystallized region formed by crystallizing an amorphous silicon film as a precursor. Details of the crystal morphology of the crystalline silicon film 4 shall be described later.

The amorphous silicon film 5 is a non-crystalline semiconductor film formed on the crystalline silicon film 4, and is an i-layer on which intentional impurity doping is not performed.

Therefore, the amorphous silicon film 5 has a high electrical resistance compared to the impurity-doped contact layers 6. It should be noted that although impurity doping is not performed, naturally included impurities exist in the amorphous silicon film 5. The impurity concentration of the amorphous silicon film 5 is $1 \times 10^{17}$ (atm/cm$^3$) or lower.

The introduction of the amorphous silicon film 5 is aimed at reducing the off-current by introducing a material having a larger bandgap than the crystalline silicon film 4. As such, it is preferable that the bandgap of the amorphous silicon film 5 be 1.60 to 1.90 eV. It should be noted that the thickness of the amorphous silicon film 5 can be set to, for example, approximately 10 to 100 nm. Furthermore, the amorphous silicon film 5 has the same shape as the crystalline silicon film 4 when seen in a plan view of the thin-film semiconductor device 100.

The introduction of the amorphous silicon film 5 is aimed at reducing the off-current by introducing a material having a larger bandgap than the crystalline silicon film 4. For the amorphous silicon film 5, it is preferable to use a material having a bandgap of 1.60 to 1.90 eV. It should be noted that the thickness of the amorphous silicon film 5 is, for example, approximately 10 to 100 nm.

Each contact layer of the pair of contact layers 6 is an amorphous semiconductor layer having a high impurity concentration or a polycrystalline semiconductor layer having a high impurity concentration, and is, for example, an n-type semiconductor layer formed by doping amorphous silicon with phosphorous (P) as an impurity, and is an n$^+$ layer having a high impurity concentration of not less than $1 \times 10^{19}$ (atm/cm$^3$).

Furthermore, each contact layer of the pair of contact layers 3 is disposed opposite the other across a predetermined gap, on the amorphous silicon film 5. Specifically, each contact layer of the pair of contact layers 6 is formed continuously on the upper surface and side surface of the amorphous silicon film 5, the side surface of the crystalline silicon film 4, and the upper surface of the gate insulating film 3. In other words, each contact layer of the pair of contact layers 6 is formed to cover the semiconductor layer. It should be noted that the thickness of the contact layers 6 can be, for example, approximately 5 to 100 nm.

Furthermore, each electrode of the pair of the source electrode 4 and the drain electrode 7 is disposed opposite the other across a predetermined gap, on a corresponding one of the pair of contact layers 6. In other words, the source electrode 7S is formed above one end of the crystalline silicon film 4 via the corresponding contact layer 6, and the drain electrode 7D is formed above the other end of the crystalline silicon film 4 via the corresponding contact layer 6.

Each of the source electrode 7S and the drain electrode 7D can be configured of a single-layer structure or multilayer structure that is made of a conductive material, or an alloy or the like of such materials, and is made of, for example, materials such as aluminum (Al), tantalum (Ta), molybdenum (Mo), tungsten (W), silver (Ag), copper (Cu), titanium (Ti), chromium (Cr), and so on. Furthermore, the source electrode 7S and the drain electrode 7D can each be formed with a MoW/Al/MoW three-layer structure. It should be noted that the thickness of the source electrode 7S and the drain electrode 7D can be, for example, approximately 100 to 500 nm.

Figure 2:
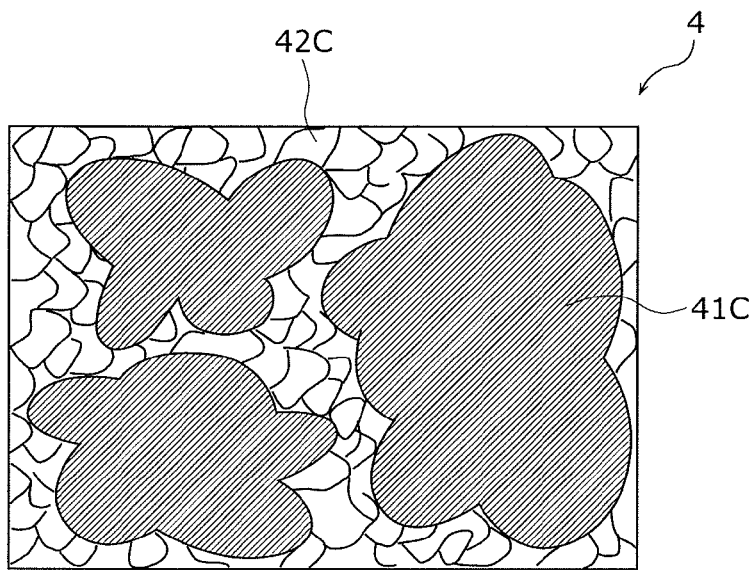
FIG. 2 is a plan view schematically showing a crystal morphology of a crystalline silicon film in the thin-film semiconductor device according to the exemplary embodiment.

Next, the crystal morphology of the crystalline silicon film 4 the in thin-film semiconductor device according to the exemplary embodiment shall be described using FIG. 2. FIG. 2 is a plan view schematically showing a crystal morphology of a crystalline silicon film in a thin-film semiconductor device according to an exemplary embodiment.

Figure 25:
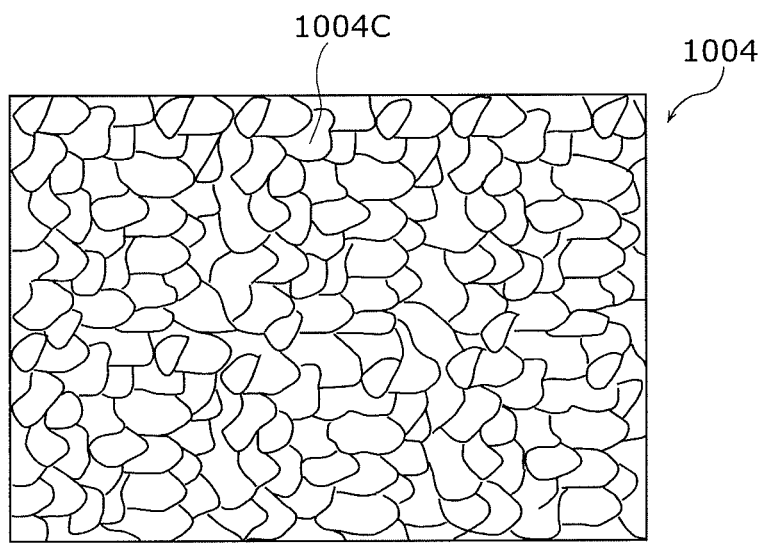
FIG. 25 is a plan view schematically showing a crystal morphology of a conventional crystalline silicon film.

Prior to describing the crystalline silicon film 4 in the exemplary embodiment, the crystal morphology of a conventional crystalline silicon film 1004 shall be described using FIG. 25. As shown in FIG. 25, the conventional crystalline silicon film 1004 has a crystal morphology made up of crystal particles 1004C having a single grain size distribution. It should be noted that the crystalline silicon film 1004 shown in FIG. 25 is formed by crystallizing an amorphous silicon film using the thermal annealing method.

In contrast, as shown in FIG. 2, the crystalline silicon film 4 in the exemplary embodiment has a crystal morphology (crystallized region) including first crystals (first crystal grains) 41C having a relatively large average crystal grain size, and second crystals (second crystal grains) 42C having a relatively small crystal grain size. In other words, the average crystal grain size of the crystal grains of the first crystals 41C is larger than the average crystal grain size of the crystal grains of the second crystals 42C. In addition, each of the first crystals 41C having a large crystal grain size is formed by the sintering of the second crystals 42C (hereafter, this structure shall be denoted in this Specification as "sintered morphology"). In the exemplary embodiment, the average crystal grain size of the crystal grains of the first crystals 41C ranges from 200 nm to 2 μm, and the average crystal grain size of the crystal grains of the second crystals 42C ranges from 20 nm to 50 nm. Here, the phenomenon of "sintering" and the "sintered crystal" which are characteristics of the sintered morphology of the crystalline silicon film 4 shall be described. Sintering is a phenomenon of mass transfer to the direction in which surface energy of the entire grain system is reduced, when grains that are in a contact state are held at a temperature lower than or equal to the melting point thereof. Sintering occurs when mass transfer of atoms occurs by performing volume diffusion, surface diffusion, and evaporation/condensation at a temperature in which occurrence of atom diffusion is sufficiently possible. The major factors in the sintering process are the diffusion coefficient of atoms, surface energy, and grain size. The temperature at which sintering occurs is different depending on the situation of the major factors, and there are cases where sintering occurs at about half the temperature of melting point. Specifically, using sintering allows crystal grain size to be increased at a temperature that is significantly lower than the melting point (silicon melting point: 1410° C.; amorphous silicon melting point: approximately 1000° C.). Furthermore, inside the crystals whose crystal grain size has increased due to sintering, the grain boundaries between the grains are lost, and thus they are expected to show material properties such as being (or having) a pseudo-single-grained structure.

Figure 3:
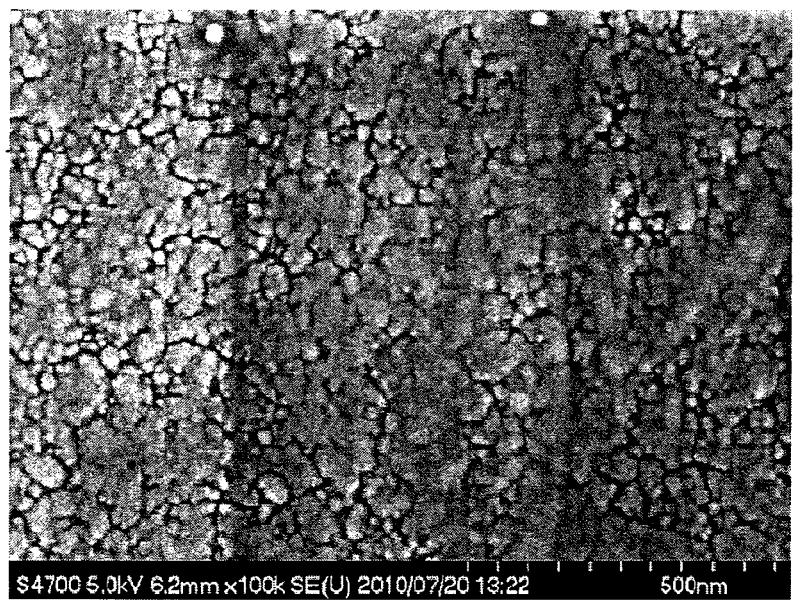
FIG. 3 is a planar scanning electron microscope (SEM) image of the crystalline silicon film according to the exemplary embodiment.

Hereinafter, the structure of a crystalline silicon film formed above a thin-film substrate according to an exemplary embodiment shall be using FIG. 3 and FIG. 4, while comparing characteristics with the conventional crystal morphology. FIG. 3 is a diagram showing a planar scanning electron microscope (SEM) image of the crystalline silicon film according to the exemplary embodiment. Furthermore, FIG. 4 is a table compiling the characteristics of the crystalline silicon film according to the exemplary embodiment and conventional crystalline silicon films. It should be noted that, as shown in FIG. 4, as to the crystal morphologies of crystalline silicon films obtained using the laser annealing (LA) method, increasing the density of energy to be irradiated makes it is possible to form a solid phase crystallization (SPC) morphology, an explosive morphology, and a molten silicon morphology.

The crystalline silicon film shown in FIG. 3 is obtained by performing thermal processing for approximately 20 minutes at a crystallization temperature of 750° C. using the thermal annealing method. The crystalline silicon film shown in FIG. 3 is a thin-film including a crystallized region obtained by crystallizing a predetermined region, and has a new crystal morphology having a crystal morphology structure different from the conventionally reported crystal morphologies such as those compiled in FIG. 4. This new crystal morphology is referred to as the "sintered morphology", and such "sintered morphology" is a structure having sintered grains for which it is thought that the crystal grains formed by SPC have lost the grain boundaries between grains due to the sintering phenomenon.

Next, the characteristics of the sintered morphology in the crystalline silicon film according to the exemplary embodiment shall be described with reference to FIG. 4 and FIG. 5A to FIG. 5C. FIG. 5A shows a planar SEM image of a crystalline silicon film having the SPC morphology obtained by LA crystallization with low energy density, and a schematic diagram thereof. FIG. 5B shows a planar SEM image of a crystalline silicon film having the explosive morphology obtained by LA crystallization with intermediate energy density, and a schematic diagram thereof. FIG. 5C shows a planar SEM image of a crystalline silicon film having the molten polysilicon morphology obtained by LA crystallization with high energy density, and a schematic diagram thereof.

First, the crystal morphology (except explosive) in the conventional crystalline silicon film has a single grain size distribution whereas the sintered morphology in the crystalline silicon film according to the exemplary embodiment (hereafter simply referred to as the "crystal morphology in the present disclosure") has the characteristic of having the two grain size distributions of crystal grains having an average crystal grain size of 200 nm to 2 μm and crystal grains having an average crystal grain size of 20 nm to 50 nm. The crystallized region of the crystalline silicon film in the exemplary embodiment has first crystals having a relatively large average crystal grain size and second crystals having a relatively small average crystal grain size. In other words, the average crystal grain size of the crystal grains of the first crystals is larger than the average crystal grain size of the crystal grains of the second crystals. In addition, as described later, each of the first crystals having a large crystal grain size is formed by the sintering of the second crystals.

Figure 6A:
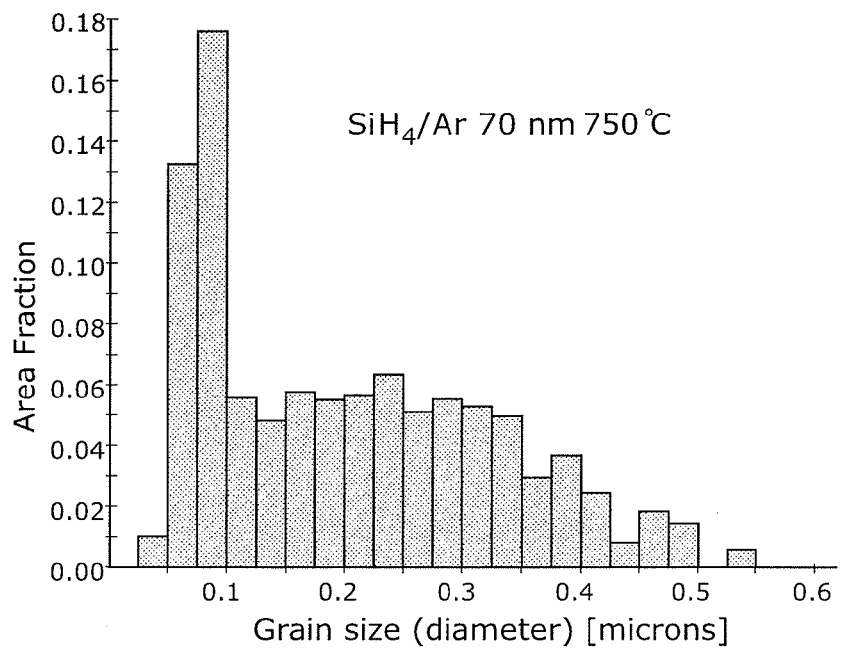
FIG. 6A is a graph showing a grain size distribution calculated from the electron backscattering pattern of the sintered morphology of the crystalline silicon film according to the exemplary embodiment.
Figure 6B:
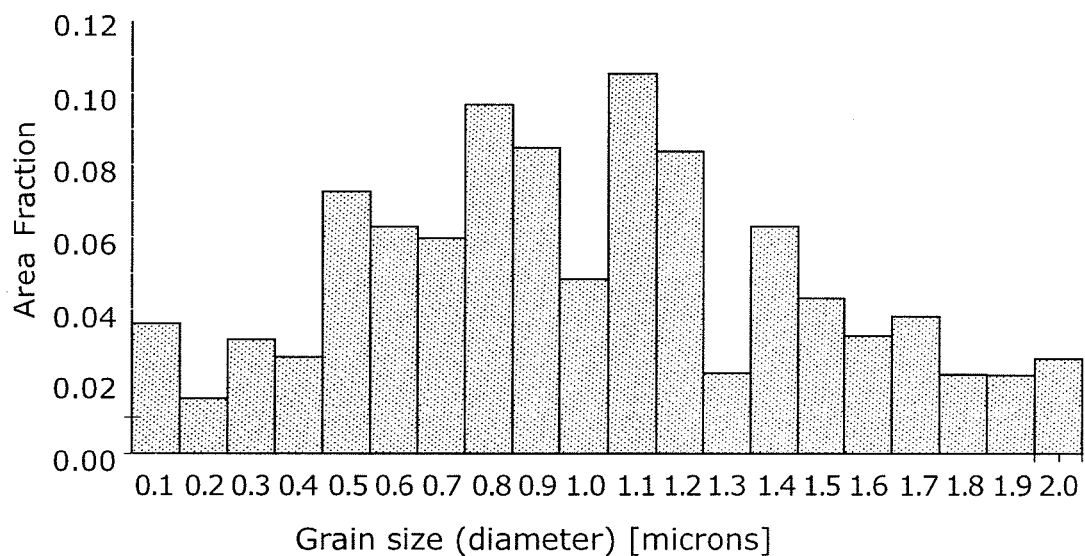
FIG. 6B is a graph showing a grain size distribution calculated from the electron backscattering pattern of the morphology of conventional molten polysilicon.

Here, grain size distributions calculated from the electron backscattering patterns (EBSPs) of the sintered morphology of the crystalline silicon film according to the exemplary embodiment and the conventional molten polysilicon morphology are shown using FIG. 6A and FIG. 6B. It can be confirmed that, although the absolute values per se are slightly different from those of the grain size obtained using planar SEM, the grain size of the crystal morphologies calculated using EBSP matches the trend of the grain size distribution described above. Therefore, like the explosive crystal morphology using the LA method, the sintered morphology in the present disclosure is a mixed crystal morphology of two types of crystal morphologies having different generation mechanisms.

Next, the difference from the explosive morphology shall be described. As described above, because the explosive morphology includes the molten polysilicon morphology, the explosive morphology is characterized in that protrusions are formed at the grain boundaries. As described in FIG. 5B, in the SEM image, the brightly contrasted parts of the grain boundary of grains that are thought to be of the molten polysilicon morphology having a relatively large grain size correspond to the protrusions. On the other hand, as shown in FIG. 3, in the sintered morphology in the present disclosure, protrusions such as those described above cannot be observed even in the grain boundaries of grains having a relatively large grain size. Therefore, it is thought that the enlargement of grain size in the sintered morphology in the present disclosure is caused not by the molten polysilicon morphology but by a different generation mechanism (sintering). The detailed mechanism shall be described later.

Figure 7A:
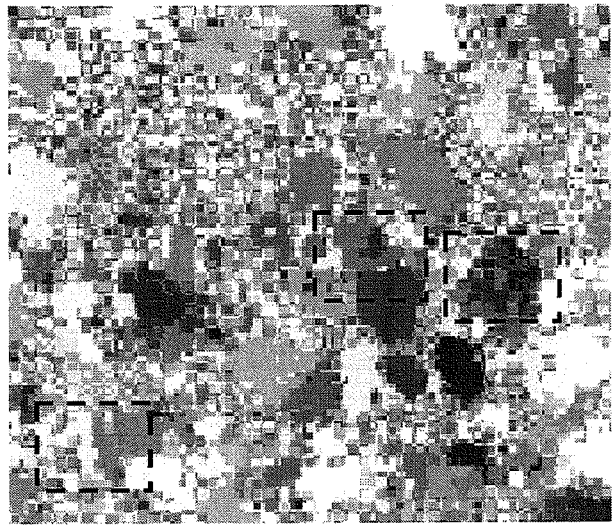
FIG. 7A is a diagram showing a crystal orientation map obtained from the electron backscattering pattern of the sintered morphology of the crystalline silicon film according to the exemplary embodiment.
Figure 7B:
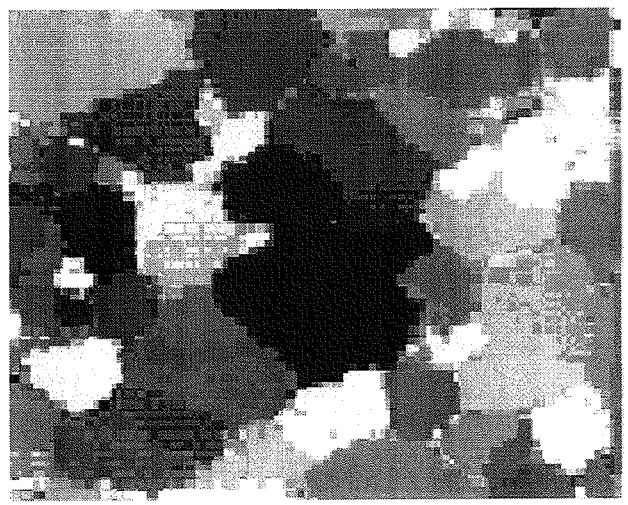
FIG. 7B is a diagram showing a crystal orientation map obtained from the electron backscattering pattern of the conventional molten polysilicon morphology.

Next, the characteristics related to the crystal structure inside a grain and the crystal orientation of the grain shall be described using the result of EBSP. FIG. 7A and FIG. 7B are crystal orientation maps obtained from the EBSP of the sintered morphology of the crystalline silicon film according to the exemplary embodiment and the molten polysilicon morphology, respectively. As shown in FIG. 7B, although structures corresponding to crystal defects such as Twin can be observed in the molten polysilicon morphology, the crystal orientation in one grain is singular, in other words, monocrystal (single-grained). In contrast, as shown in FIG. 7A, in the grain of the sintered morphology in the present disclosure, there is a region (the region surrounded by the broken lines in the figure) that is surrounded by a different crystal (a crystal having a different crystal orientation) inside a grain having a large grain size. This result also suggests that the grains of the sintered morphology in the present disclosure are not generated by molten crystallization. Such a sintered morphology is expected to show material properties such as being (or having) a pseudo-single-grained structure despite allowing forming at low temperature. Furthermore, as shown in FIG. 7A, since crystals other than those of the sintered morphology are of the SPC morphology, they are formed mainly having a single-grained structure (grain boundary is a plane having a single crystal orientation). In this manner, sintering progresses easily in a single-grained crystal or where the grain boundary is a plane having a single crystal orientation, and, through the formation of a fused crystal by sintering, it is possible to form a crystallized region in which the first crystals, which include crystals formed with different crystal orientations, are present.

It should be noted that crystals found inside a sintered crystal and having different crystal orientations shall be referred to as "subgrains". Furthermore, although it has been described that the grain boundaries located between subgrains are lost, grain boundaries can be faintly verified using an SEM image, and such grain boundaries shall be referred to as "subgrain boundaries". It should be noted that, since a subgrain boundary is formed by crystals having different orientations, the subgrain boundary is formed between subgrains by plural crystal faces.

Figure 8:
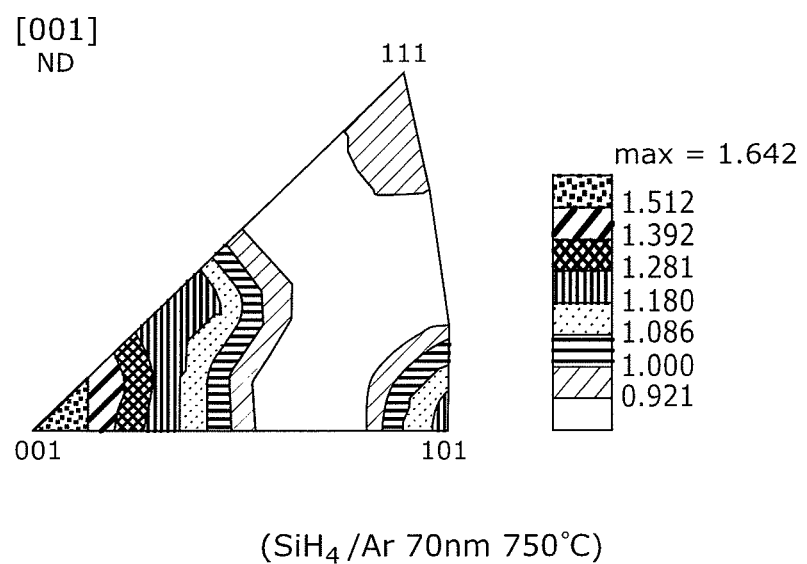
FIG. 8 shows an inverse pole figure for the sintered morphology of the crystalline silicon film according to the exemplary embodiment.

In this manner, a first crystal contains subgrains formed with different crystal orientations in a single crystal, and includes subgrain boundaries formed between the subgrains by plural crystal faces. In contrast, a second crystal which is smaller than the average grain size of the first crystals is what is called single-grained (a single-grained structure) in which no boundaries exist therein. In an SEM image, the contrast of subgrain boundaries formed inside a sintered crystal is displayed weaker than the grain boundary between second crystals Furthermore, FIG. 8 shows an inverse pole figure for the sintered morphology of the crystalline silicon film according to the exemplary embodiment. The molten polysilicon morphology crystallized using the conventional excimer LA method is known to be directed to the <111> direction but the sintered morphology in the present disclosure is characterized in having virtually no orientation as shown in FIG. 8.

As described above, the crystalline silicon film according to the exemplary embodiment has a sintered morphology having sintered grains that have lost the grain boundaries between the grains due to the sintering phenomenon. Furthermore, with to the crystalline silicon film according to the exemplary embodiment, the protrusions formed in the grain boundaries and which are considered to be a problem in the molten crystal are not formed, and thus, by improving the adhesion with an overlying layer, it is possible to improve the reliability of devices and processes that use the crystalline silicon film according to the exemplary embodiment.

(Method of Forming and Growth Mechanism of Crystalline Silicon Film)

Figure 9:
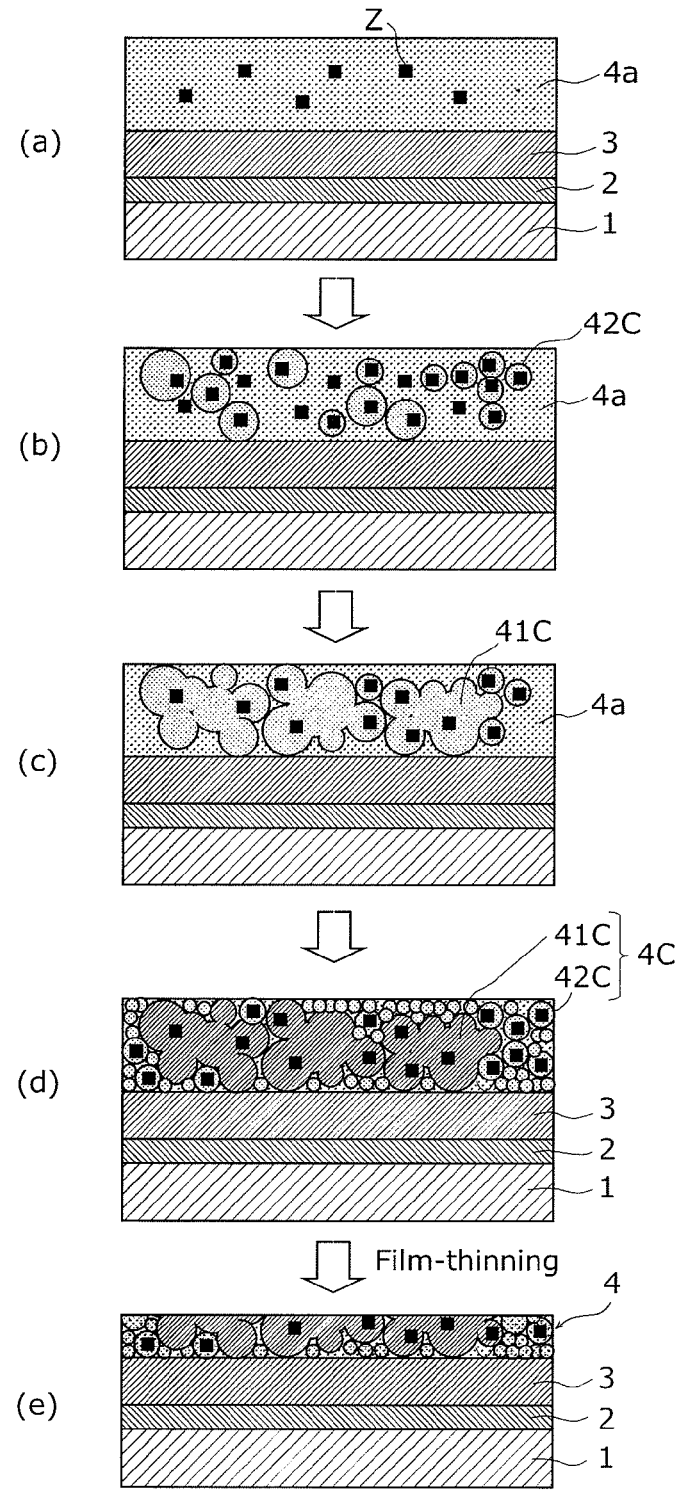
FIG. 9 is a diagram for describing a method of forming the crystalline silicon film and mechanism for generating the sintered morphology in the exemplary embodiment.

Next, a method of forming the crystalline silicon film 4 in the exemplary embodiment, including the mechanism by which the sintered morphology is generated, shall be described using FIG. 9. FIG. 9 is a diagram for describing the method of forming the crystalline silicon film in the exemplary embodiment.

First, as shown in (a) in FIG. 9, a glass substrate, for example, is prepared as the glass substrate 1 (glass preparation process). It should be noted that, when the subsequent crystallization processing is to be performed directly on top of the substrate 1, it is advisable to remove impurities such as organic substances found on the surface of the substrate 1 using a predetermined chemical solution because the state of the interface between the substrate 1 and a precursor film (amorphous silicon film) affects crystal growth. Furthermore, an undercoat layer (not shown in the figure) made of a silicon oxide film ($SiO_x$), a silicon nitride film ($SiN_x$), or a silicon oxynitride (SiON), and the like, may be formed on the substrate 1 using plasma CVD or the like.

Next, as shown in (a) in FIG. 9, the gate electrode 2 is formed in a predetermined shape above the substrate 1 (gate electrode forming process). For example, a gate metal film is formed above the entirety of the substrate 1, and the gate metal film is patterned by performing photolithography and wet etching, to thereby form the gate electrode in the predetermined shape.

Next, as shown in (a) in FIG. 9, the gate insulating film 3 is formed above the gate electrode 2 (gate insulating film forming process). For example, the gate insulating film 3 is formed above the entirety of the substrate 1 so as to cover the gate electrode 2.

Next, as shown in (a) in FIG. 9, an amorphous silicon film 4a is formed, as an amorphous film, above the gate insulating film 3 (amorphous film forming process). The amorphous silicon film 4a is a precursor film which, by being crystallized, becomes a crystalline silicon film. For example, the precursor film is a film that includes a region (pseudo-crystal nucleus) in which the amount of bonds between Si atom and Si atom is high locally in the amorphous silicon film 4a. In addition, the amorphous silicon film 4a, which is to be the precursor film, includes starting points Z which undergo crystal growth through thermal annealing. The primary component of the starting point Z is the above-described pseudo-crystal nuclei but there are also instances where other film defects, and so on, also become starting points. Furthermore, in the precursor film (amorphous silicon film 4a), a starting point (pseudo-crystal nucleus) from which crystal is generated is generated with high density compared to the conventional long-time SPC growth.

The amorphous silicon film 4a (precursor film) such as that described above can be formed using plasma CVD, or the like, and can be formed under film-forming conditions in which, for example, silane ($SiH_4$) is used as the source gas, an inert gas such as hydrogen, argon, or helium is used as a diluent gas, the film-forming temperature is set to 250 to 500° C. and the growth pressure is set to 0.1 to 10 Torr. The thickness of the amorphous silicon film 4a is, for example, approximately 20 to 100 nm. It should be noted that aside from silane gas, disilane gas or trisilane gas can also be used as a source gas.

Figure 10:
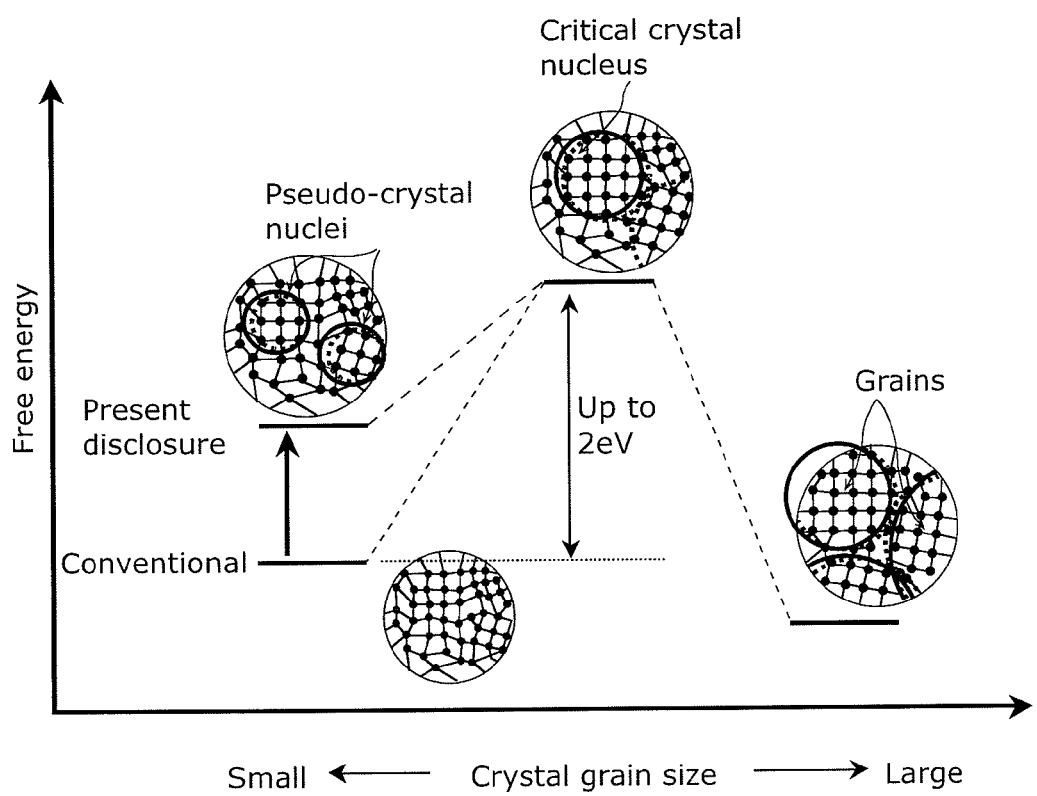
FIG. 10 is a diagram schematically showing a relationship between free energy and the silicon film crystal grain size, in an amorphous silicon film in the exemplary embodiment.

Here, the crystallization mechanism of the amorphous silicon film shall be described using FIG. 10. FIG. 10 is a diagram for describing the crystallization mechanism of the amorphous silicon film in the exemplary embodiment, and is a diagram schematically showing the relationship between free energy and the silicon film crystal grain size. In FIG. 10, the vertical axis denotes free energy, and the horizontal axis denotes crystal grain size.

As shown in FIG. 10, generally, in the solid phase crystallization (SPC) of a crystalline silicon film, it is possible to have a stage in which crystal nuclei are formed inside the non-crystalline silicon (amorphous silicon) film following the increase in free energy, and crystals grow from the crystal nuclei.

The free energy for generating a crystal nucleus tends to increase since the surface energy becomes dominant as the crystal nucleus size is smaller. When the crystal nucleus size exceeds the critical crystal nucleus size (approximately 1 to 2 nm), free energy decreases which promotes crystal growth.

In this case, in order to have crystal growth of the conventional crystalline silicon film using the solid phase crystallization, it is necessary to overcome the approximately 2 eV energy barrier required for crystal nucleus generation, and this barrier becomes the rate determining process in the crystal growth. In contrast, in the non-crystalline silicon film (precursor film) in the exemplary embodiment, small crystal nuclei (pseudo-crystal nuclei) having an average grain size that is less than or equal to the average grain size of the critical crystal nucleus is generated in the film before hand, and thus the free energy of the precursor film can be increased immediately after the film-forming as shown in FIG. 10. In other words, it becomes possible to lower the barrier of the activation energy required in the crystal nuclei forming. It should be noted that, as described above, the pseudo-crystal nucleus is a region in which the amount of bonds between Si atom and Si atom is locally high in the silicon film, and the average grain size of the pseudo-crystal nucleus is 1 nm or lower.

In this manner, in the exemplary embodiment, pseudo-crystal nuclei having increased free energy exist in the amorphous silicon film (precursor film) immediately after film-forming (before crystallization annealing), and thus it is possible to reduce the activation energy of crystallization in the subsequent crystallization annealing. Therefore, it is possible to reduce the activation energy of crystallization and lower the crystallization temperature.

Next, as shown in (b) to (d) in FIG. 9, a crystalline silicon film 4C having a crystal morphology including first crystals 41C and second crystals 42C is formed by performing thermal annealing on the amorphous silicon film 4a (crystallization annealing process). Hereinafter, the crystallization mechanism of the amorphous silicon film 4C, that is, the mechanism for generating sintered crystals shall be described.

When thermal annealing is performed on the amorphous silicon film 4a, crystals grow with the starting points Z as the crystal nuclei, as shown in (b) in FIG. 9. Accordingly, first, the second crystals 42C having a small grain size are generated as shown in (b) in FIG. 9. Then, as shown in (c) in FIG. 9, during the process in which the second crystals 42C are generated, silicon grains of the second crystals 42C are sintered and become fused grains thereby generating the first crystals 41C having a relatively large grains size and the sintered morphology. Specifically, since grains having a small grain size are formed at high density, the surface energy of the grain system becomes large, and it is possible that, through the sintering of grains in order to reduce this surface energy, the surface area of the crystals is reduced and a crystal having a large grain size is formed.

Furthermore, during thermal annealing, new crystal nuclei are generated in the amorphous silicon film 4a, crystals also grow from these crystal nuclei, and the second crystals 42C are generated. In this manner, as shown in (d) in FIG. 9, it is possible to form the crystalline silicon film 4C having the crystal morphology including the first crystals 41C and the second crystals 42C.

In this manner, in the exemplary embodiment, pseudo-crystal nuclei having increased free energy exist in the amorphous silicon film 4a (precursor film) immediately after film-forming, and thus it is possible to reduce the activation energy of crystallization in the subsequent crystallization annealing. As such, crystals having high density and a small grain size are formed, and sintering of the grains thereof enables the forming of grains having a large grain size.

Here, in order to obtain the desired grain size in the sintered morphology, it is sufficient to adjust the annealing temperature, the annealing time, and the thickness of amorphous silicon film 4a which becomes the precursor film. By raising the annealing temperature, lengthening the annealing time, and increasing the thickness of the amorphous silicon film 4a, an increase in crystal grain size can be expected. This is because, when the annealing temperature is raised, the crystal nuclei which become starting points for crystal growth are generated with high density, this inhibition of crystal growth causes the crystal grain size of the second crystals 42C to become small, and, consequentially, the area of contact between silicon grains of the second crystals 42C increases, thereby allowing the growth of the first crystals 41C having a larger crystal grain size. Furthermore, crystal grain size increases when annealing time is lengthened because the sintering time in which the first crystals 41C grow is lengthened, thereby allowing the growth of the first crystals 41C having a larger crystal grain size. In addition, crystal grain size increases due to increased thickness of the amorphous silicon film 4a because, at the time of crystal growing in (b) in FIG. 9, the number of silicon grains of the second crystals 42C increases which causes the area of contact between silicon grains of the second crystals 42C to increase, thereby allowing the growth of the first crystals 41C having a large crystal grain size.

Forming of the crystalline silicon film 4C having the above-described sintered morphology can be realized by, for example, performing thermal annealing on the amorphous silicon film 4a at a temperature of 500° C. to 1000° C. as a condition which allows crystal growth of silicon crystal grains with the starting points Z as crystal nuclei. As thermal annealing methods, it is possible to use, for example, a rapid thermal annealing (RTA) method, a laser annealing (LA) method, a flash lamp annealing method, or the like. Furthermore, when using the rapid thermal annealing method, performing one minute to two hours of thermal annealing makes it possible to generate and fuse together second crystals 42C to generate first crystals 41C having the sintered morphology. It should be noted that it is preferable that the thermal annealing temperature be set to a range of 700° C. to 800° C. This is because, when a glass substrate is used as the substrate 1, it is preferable that annealing be performed at a temperature of 800° C. or lower in order to suppress damage to or distortion of the glass substrate. In this case, it is preferable that the thermal annealing time be set to a range of 1 minute to 30 minutes.

(Method of Forming a Precursor Film Having Pseudo-crystal Nuclei)

Here, the method of forming the amorphous silicon film 4a (precursor film) having the pseudo-crystal nuclei described above shall be described using FIG. 11A, FIG. 11B, and FIG. 12.

Figures 11A, 11B:
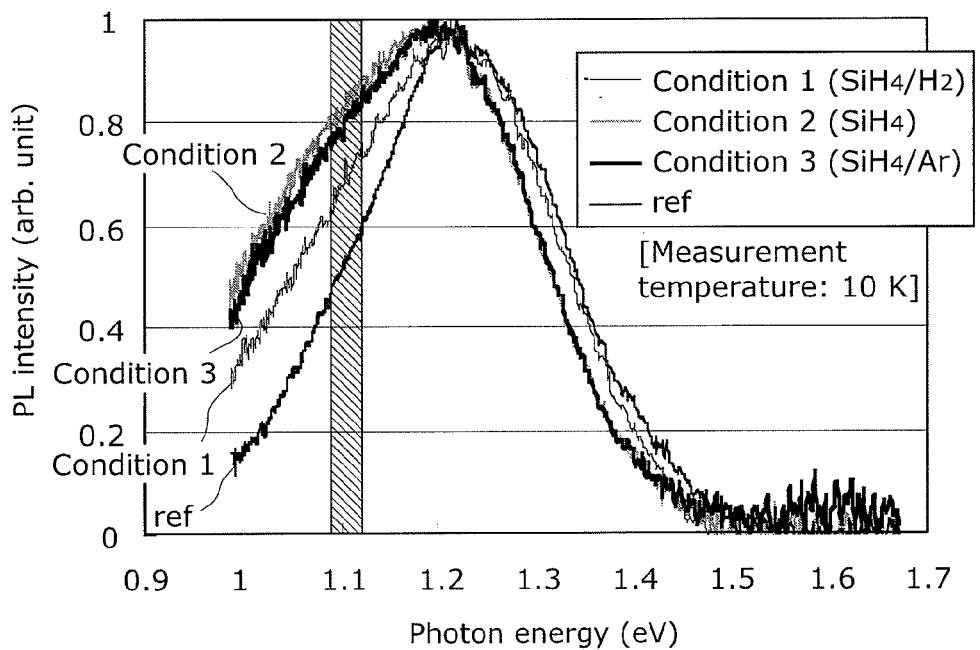
FIG. 11A is a graph showing respective photoluminescence (PL) spectra of amorphous silicon films according to the exemplary embodiment and an amorphous silicon film according to a comparative example.
FIG. 11B is a table showing film-forming conditions when forming four crystalline silicon films in FIG. 11A.

FIG. 11A is a graph showing the respective photoluminescence (PL) spectra of amorphous silicon films (precursor films) according to the exemplary embodiment and an amorphous silicon film (precursor film) according to a comparative example. The photoluminescence spectra shown in FIG. 11A are normalized such that maximum PL intensity is set to 1. In FIG. 11A, the vertical axis denotes PL intensity and the horizontal axis denotes photon energy. FIG. 11B is a table showing film-forming conditions when forming the precursor films under the four conditions in FIG. 11A. Condition 1, condition 2, and condition 3 denote film-forming conditions according to the exemplary embodiment, and the condition Ref denotes the film-forming conditions according to the comparative example. Furthermore, FIG. 12 is a schematic diagram for describing a light-emitting mechanism of non-crystalline silicon.

First, the light-emitting process of the precursor film and the change in the PL spectrum associated with such process shall be described with reference to FIG. 12.

Figure 12:
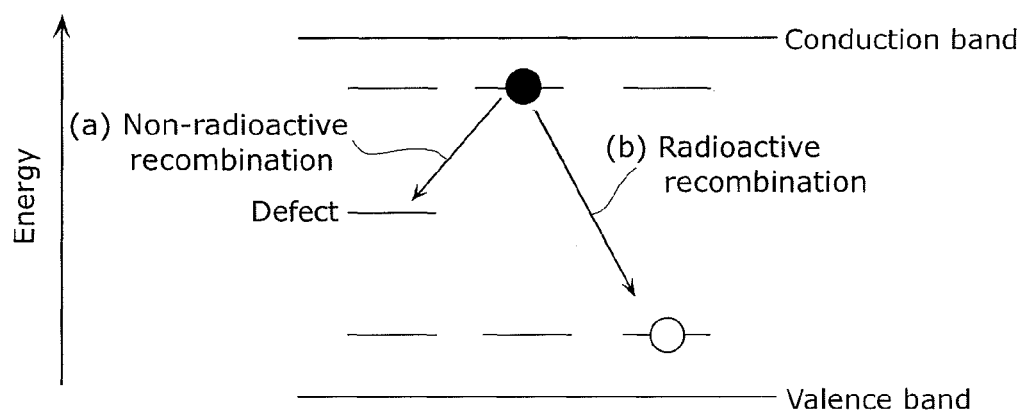
FIG. 12 is a schematic diagram for describing a light-emitting mechanism of non-crystalline silicon.

Since the exciton generated by photoexcitation disappears in the high temperature region due to non-radiative recombination via the localized level formed by the dangling bonds, and so on, of silicon, lowering the temperature results in radiative recombination accompanied by light emission becoming dominant (process (a) in FIG. 12). As such, in the exemplary embodiment, measurement of PL intensity was performed with the measurement temperature at 10 K.

Here, as shown in FIG. 11A, the PL spectra of the amorphous silicon films under the respective conditions are observed as broad light emission spectra in which multiple peaks (modes) are present, and there are large peaks at least from 1.2 to 1.4 eV and in the vicinity of 1.1 eV. Of these, the maximum PL intensity appears between 1.2 and 1.4 eV, and in FIG. 11A, the peak in the vicinity of 1.2 eV is the maximum PL intensity.

It is possible that this light-emission band is caused by the optical transition between localized levels of band ends including the band tail of the PL spectrum (process (b) in FIG. 12). The shape and location of the peak of the PL spectrum reflects the band end localized level density distribution, that is, the structure of the amorphous silicon film.

As shown in FIG. 11A, compared to the PL spectrum according to the comparative example under the condition Ref, the entirety of each of the PL spectra according to the exemplary embodiment under condition 1, condition 2, and condition 3 shifts to the low energy side, that is, the PL intensity of the peak appearing in the vicinity of 1.1 eV is great.

It is thought that, compared to the amorphous silicon film under condition Ref, a region (pseudo-crystal nucleus) having a large amount of bonds between Si atom and Si atom is formed locally in the amorphous silicon films under condition 1 to condition 3. Specifically, it is possible that the PL intensity of the peak appearing when photon energy is in the vicinity of 1.1 eV shows the amount of bonds between Si atom and Si atom, and, the greater the PL intensity at the vicinity of 1.1 eV, the larger the amount of bonds between Si atom and Si atom in the amorphous silicon film.

Therefore, for the PL spectra shown in FIG. 11A, by forming an amorphous silicon film having a PL intensity of 0.65 or higher when photon energy is in the vicinity of 1.1 eV, that is, by forming an amorphous silicon film for which the ratio of peak intensity when photon energy is 1.1 eV to maximum PL intensity is 0.65 or higher, it is possible to obtain the amorphous silicon film 4a in which pseudo-crystal nuclei are present.

Accordingly, since it is possible to form a region (pseudo-crystal nucleus) in which the density of bonds between Si atom and Si atom is high locally in the amorphous silicon film which is the precursor film of the crystalline silicon film, the activation energy of crystallization in the crystallization annealing can be reduced, and it is possible to lower the temperature (increase the grain size compared to the grain size at the same crystallization temperature in the conventional method). Therefore, the grain size of the crystalline silicon film formed according to the exemplary embodiment can be made bigger than the grain size of the crystalline silicon film that has undergone the same crystallization annealing as in the conventional method. Therefore, by manufacturing a TFT having, as a channel layer, the crystalline silicon film formed according to the exemplary embodiment, it is possible to improve on-state current. Here, "a region in which the density of bonds between Si atom and Si atom is high" refers not to a region in which the crystal grain size is for example 5 nm or several tens of nm or higher, as in polycrystalline silicon or microcrystalline silicon, but to a region in which the density of bonds between Si atom and Si atom that are bonded in a diamond bond structure is high, and in which the density of bonds between Si atom and Si atom having an amorphous structure is less than the bond density for the bonding in the diamond-bond structure.

Next, as shown in (e) in FIG. 9, the crystalline silicon film 4C is thinned by reducing the thickness of the crystalline silicon film 4C (film-thinning process). With this, the crystalline silicon film 4 can be formed. In other words, the crystalline silicon film 4C prior to the thinning is a precursor film of the crystalline silicon film 4. The thinning of the crystalline silicon film 4C can be performed by removing the top portion of the crystalline silicon film 4C by etching. For the method of etching, it is possible to use wet etching or dry etching. For wet etching, it is possible to use, for example, etching that uses a dilute hydrofluoric acid (DHF) solution. By using a dilute hydrofluoric acid solution, the crystalline silicon film 4C can be etched without inflicting charge damage.

It should be noted that, for example, in the film-thinning process, the amount of etching on the crystalline silicon film 4C, in the thickness direction within the substrate surface is made uniform, as shown in (e) in FIG. 9 which schematically shows the cross-sectional structure during the film-thinning.

Figure 13:
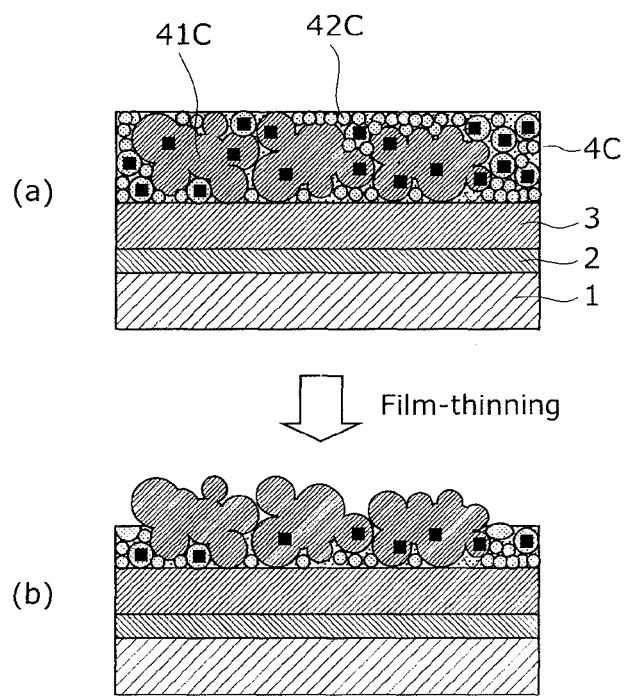
FIG. 13 is a diagram for describing the case when a crystalline silicon film having the sintered morphology is unevenly etched.

This is due to the subsequent reason. For example, as shown in (a) and (b) in FIG. 13, during the etching of the crystalline silicon film 4C, when the second crystal 42C is preferentially etched over the first crystals 41C, the thickness of the crystal region of the second crystals 42C decreases more than that of the first crystals 41C. With this, the resistance of the crystalline silicon film 4 after the film-thinning increases, and carrier conduction is inhibited during TFT driving. In other words, in this case, an increase in the mobility of the TFT due to the thinning of the crystalline silicon film 4C cannot be expected. Furthermore, in the case of FIG. 13, the difference in the amount of etching between the first crystals 41C and the second crystals 42C also causes the thickness within the substrate surface to become uneven, and thus it is possible that unevenness in electrical characteristics also increases. Therefore, for example, the amount of etching in the film thickness direction of the crystalline silicon film 4C is uniform within the substrate surface.

In (e) in FIG. 9, although the etching of the crystalline silicon film 4C can be performed using a dilute hydrofluoric acid (DHF) solution, in order to perform etching so as to obtain a uniform thickness within the substrate surface, for example, the upper surface of the crystalline silicon film 4C is oxidized (crystalline film surface oxidation process) prior to immersion in the dilute hydrofluoric acid solution. As a method for oxidizing the upper surface of the crystalline silicon film 4C, ozone oxidation, for example, can be used. In this manner, by oxidizing the upper surface of the crystalline silicon film 4C, silicon oxide of uniform thickness can be formed in the upper surface of the crystalline silicon film 4C. Therefore, by etching only this silicon oxide using hydrofluoric acid solution, or the like, the crystalline silicon film 4C can easily be etched to obtain a uniform thickness. It should be noted that, even in the case of film-thinning using a dry etching method, for example, the crystalline silicon film 4C is etched to obtain a uniform thickness within the substrate surface. Furthermore, as a method of thinning the crystalline silicon film 4C, a chemical mechanical polishing (CMP) method can be used. By using CMP, it is possible to easily remove a uniform thickness of the crystalline silicon film 4C.

Furthermore, in the exemplary embodiment, it is preferable that the thickness of the crystalline silicon film prior to the film-thinning (that is, the crystalline silicon film 4C), be 55 nm or more, and that the thickness of the crystalline silicon film after the film-thinning (that is, the crystalline silicon film 4) be 20 to 50 nm.

Next, the advantageous effect of the thin-film semiconductor device 100 according to the exemplary embodiment shall be described.

First, the thin-film semiconductor device 100 according to the exemplary embodiment can obtain relatively high mobility. In the thin-film semiconductor device 100, the crystalline silicon film 4 which is to become the channel portion is formed with a sintered morphology including the first crystals 41C having a large average crystal grain size and the second crystals 42C having a small average crystal grain size, as shown in FIG. 2. Mobility in the TFT has a negative correlation with the number of crystal defects of the crystalline silicon film 4 which is to become the channel portion, in the carrier conduction path during driving. This is because, when the number of crystal defects is large, more of the conducted carriers are scattered, and thus carrier conduction is inhibited. The aforementioned crystal defects include, specifically, the crystal grain boundaries and defects inside the crystal grains. When the crystalline film is formed as a polycrystal, the degree of scattering of carriers for the crystal defects in the carrier conduction path is larger for the crystal grain boundaries than for the defects inside the crystal grains. This is because the crystal grain boundaries occupy a larger part of the volume of the crystal defects in the carrier conduction path than the defects within the crystal grains. As such, the crystal grain boundaries are more dominant in terms of impact on mobility. On the other hand, when the crystal grain size is large, the number of crystal grain boundaries in the carrier conduction path during driving is reduced. As such, when the crystal grain size of the crystalline silicon film is large, the mobility of the TFT having the above-described crystalline film as a channel increases.

As described above, according to the thin-film semiconductor device 100 in the exemplary embodiment, the crystalline silicon film 4 which is to become the channel portion has the sintered morphology including the first crystals 41C having a large crystal grain size, and thus mobility in the TFT can be increased.

Furthermore, the thin-film semiconductor device 100 according to the exemplary embodiment can suppress unevenness in electrical-characteristics.

First, as an electrical characteristic, unevenness in mobility shall be described. Unevenness in mobility has a positive correlation with the unevenness of crystal defects in the crystalline film which is to become the channel portion, in the carrier conduction path during driving. As described earlier, since the crystal grain boundaries are more dominant in terms of the impact of crystal defects on mobility, the unevenness in mobility has a positive correlation with the unevenness of crystal grain boundaries in the carrier conduction path during driving. In addition, unevenness of crystal grain boundaries is proportional to the number of crystal grain boundaries in the carrier conduction path during driving. Accordingly, the unevenness in mobility is determined by the number of crystal grain boundaries in the carrier conduction path during driving.

Next, unevenness in off-current shall be described from the point of view of the crystallinity of the crystalline silicon film 4. The off-current at the voltage when the TFT is driven is the current generated from the crystal defects inside the crystalline silicon film 4 which is to become the channel portion. In addition, the crystal defects having a large impact on the off-current are the crystal grain boundaries. This is because the crystal grain boundaries occupy a larger part of the volume of the crystal defects in the carrier conduction path than the defects within the crystal grains. As such, the unevenness in off-current is determined by the number of crystal grain boundaries in the carrier conduction path.

In this manner, the unevenness in electrical characteristics of the thin-film semiconductor device 100 is determined by the number of crystal grain boundaries in the carrier conduction path.

According to the thin-film semiconductor device 100 in the exemplary embodiment, the crystalline silicon film 4 which is to become the channel portion is formed by thinning the crystalline silicon film 4C formed with the sintered morphology.

Here, by thinning the crystalline silicon film 4C in such a way that that the percentage of the first crystals 41C included in the crystalline silicon film 4 remaining after the film-thinning is higher than the percentage of the first crystals 41C included in the crystalline silicon film 4 before the film-thinning, it is possible to increase the percentage of the first crystals 41C in the length of the path up to where the carriers that have entered the crystalline silicon film 4 reach the channel region (the lower surface of the crystalline silicon film). In other words, the percentage of the first crystals 41C in the upper surface of the crystalline silicon film 4 after the film-thinning can be made greater than the percentage of the first crystals 41C in the lower surface of the crystalline silicon film 4 after the film-thinning. As a result, it is possible to reduce the number of crystal grain boundaries in the region in the thickness direction in the carrier conduction path. Therefore, unevenness in electrical characteristics can be reduced.

It should be noted that, in the crystalline silicon film 4, more first crystals 41C are formed in the region near the center than in the regions near the upper surface or the lower surface. As such, by performing the film-thinning to leave behind a thickness that is more than half compared to the original thickness of the crystalline silicon film 4, the percentage of the first crystals 41C in the carrier conduction path can be increased, and thus the unevenness in the electrical characteristics can be reduced. It should be noted that, even when more than half of the thickness is not to be left behind, the above advantageous effect can be obtained by determining the amount of thickness to be reduced as appropriate, depending on the way that the first crystals 41C are grown.

Furthermore, by making the thinned crystalline silicon film 4 into a channel, a sintered morphology including the first crystals 41C having a large crystal grain size is generated, and thus mobility in the TFT can be increased.

As described above, according to the thin-film semiconductor device 100 in the exemplary embodiment, it is possible to realize a TFT having high mobility and low electrical characteristic unevenness.

Furthermore, in the crystalline silicon film 4, for example, the percentage content of the first crystals included in the crystalline silicon film 4 be higher on the source electrode 7S and drain electrode 7D-side than on the gate insulating film 3-side in the thickness direction of the crystalline silicon film 4. With this, it is possible to further increase the mobility in the TFT and suppress electrical characteristic unevenness.

Furthermore, by using the thinned crystalline silicon film 4 in a thin-film semiconductor device, it is possible to suppress the contact resistance between the semiconductor layer and the overlying layer in the thin-film semiconductor device, and thus electrical characteristics such as mobility and the like can be improved.

As described earlier, in the crystalline silicon film 4, more first crystals 41C are formed in the region near the center than in the regions near the upper surface or the lower surface. As such, the area of the first crystals 41C exposed in the upper surface of the crystalline silicon film 4 after the film-thinning becomes larger than the area of the first crystals 41C exposed in lower surface of the crystalline silicon film 4 before the film-thinning. This event is synonymous to the area of the first crystals 41C exposed in the upper surface of the crystalline silicon film 4 after the film-thinning becoming larger than the area of the first crystals 41C exposed in lower surface of the crystalline silicon film 4 after the film-thinning.

As such, through the film-thinning of the crystalline silicon film 4, it is possible to suppress the contact resistance between the crystalline silicon film 4C and the overlying layer, and thus electrical resistance of the thin-film semiconductor device can be improved.

(Bottom-gate TFT Configuration)

Hereinafter, the configurations of 4 types of bottom-gate TFTs according to the exemplary embodiment shall be described with reference to FIG. 14A to FIG. 14D.

Figure 14A:
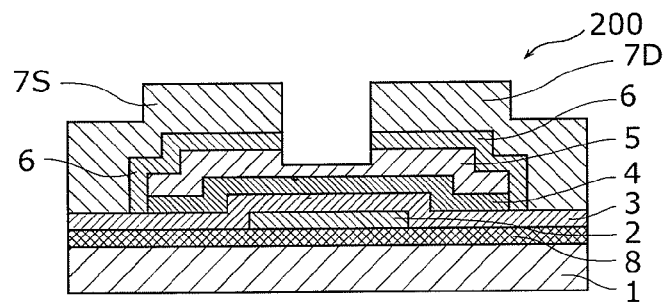
FIG. 14A is a cross-sectional view schematically showing a configuration of a first bottom-gate TFT according to the exemplary embodiment.

FIG. 14A is a cross-sectional view that schematically shows the configuration of a first bottom-gate TFT 200 according to the exemplary embodiment. In the same manner as the thin-film semiconductor device 100 shown in FIG. 1A, the configuration of the first bottom-gate TFT 200 shown in FIG. 14A is that of a channel etching TFT which is formed by etching a semiconductor layer (here, the amorphous silicon film 5) during the forming of the source region and the drain region.

As shown in FIG. 14A, the first bottom-gate TFT 200 includes: the substrate 1; an undercoat layer 8 formed on the substrate 1; the gate electrode 2 formed on the undercoat layer 8; the gate insulating film 3 formed on the gate electrode 2; the crystalline silicon film 4 formed on the gate insulating film 3; the amorphous silicon film 5 formed above the crystalline silicon film 4; the pair of contact layers 6 formed on the amorphous silicon film 5; and the source electrode 7S and the drain electrode 7D which are formed on the pair of contact layers 6. In this manner, compared to the thin-film semiconductor device 100 shown in FIG. 1A, the undercoat layer 8 is formed in the bottom-gate TFT shown in FIG. 14A. It should be noted that, the crystalline silicon film 4 is formed according to the method of forming the crystalline silicon film 4 according to the exemplary embodiment, described above.

Figure 14B:
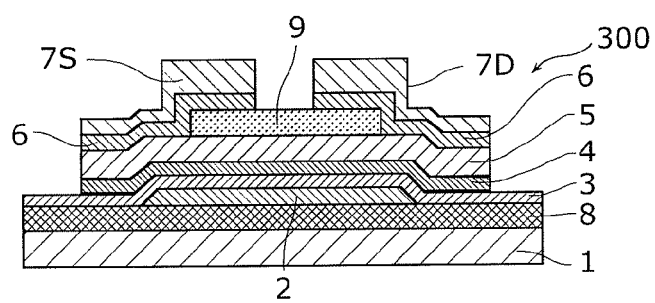
FIG. 14B is a cross-sectional view schematically showing a configuration of a second bottom-gate TFT according to the exemplary embodiment.
Figure 14C:
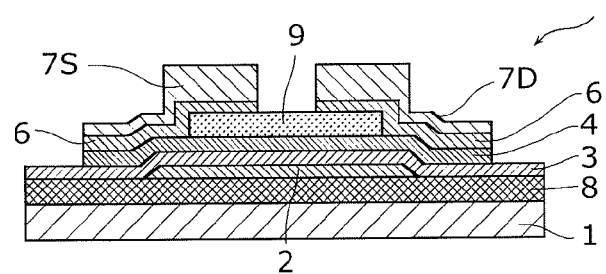
FIG. 14C is a cross-sectional view schematically showing a configuration of a third bottom-gate TFT according to the exemplary embodiment.
Figure 14D:
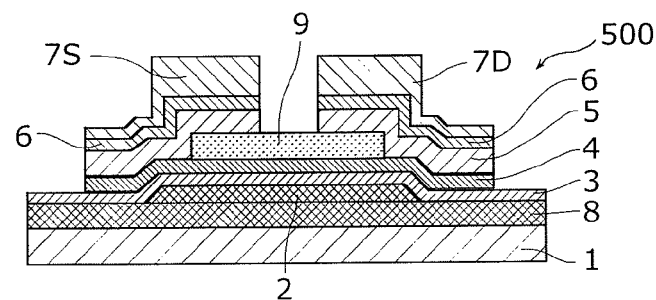
FIG. 14D is a cross-sectional view schematically showing a configuration of a fourth bottom-gate TFT according to the exemplary embodiment.

Furthermore, FIG. 14B, FIG. 14C, and FIG. 14D are cross-sectional views schematically showing the configuration of a second bottom-gate TFT 300 according to the exemplary embodiment, the configuration of a third bottom-gate TFT 400 according to the exemplary embodiment, and the configuration of a fourth bottom-gate TFT 500 according to the exemplary embodiment, respectively. The configurations of the respective TFTs shown in FIG. 14B to FIG. 14D are channel etch-stop (CES) TFTs in which a channel protecting layer 9 is formed in order to protect a semiconductor region from being etched during the forming of a source region and a drain region.

The following points are the differences among the configurations of the respective TFTs in FIG. 14B to FIG. 14D. A point of difference is that, in FIG. 14B, the amorphous silicon film 5 is formed between the crystalline silicon film 4 and the channel protecting layer 9, whereas, in FIG. 14C, the amorphous silicon film 5 is not formed. Furthermore, in FIG. 14D, the point of difference is that the amorphous silicon film 5 is formed on the channel protecting layer 9 (between the channel protecting layer 9 and the contact layers 6). The configuration in FIG. 14 B shall be described in detail below as an example.

As shown in FIG. 14B, the second bottom-gate TFT 300 includes: the substrate 1; the undercoat layer 8 formed on the substrate 1; the gate electrode 2 formed on the undercoat layer 8; the gate insulating film 3 formed on the gate electrode 2; the crystalline silicon film 4 formed on the gate insulating film 3; the amorphous silicon film 5 formed above the crystalline silicon film 4; the channel protecting layer 9 formed on the amorphous silicon film 5; the pair of contact layers 6 formed on both ends of the amorphous silicon film 5 and covering both ends of the channel protecting layer 9; and the pair of the source electrode 7S and the drain electrode 7D which are formed on the pair of contact layers 6. It should be noted that, even in the second bottom-gate TFT 300, the crystalline silicon film 4 is formed according to the method of forming the crystalline silicon film 4 according to the exemplary embodiment, described above.

Although the respective structural elements of the second bottom-gate TFT 300 according to the exemplary embodiment shown in FIG. 14B shall be described in detail below, description shall center on the points of difference with the thin-film semiconductor device 100 shown in FIG. 1A.

In the second bottom-gate TFT 300, as the undercoat layer 8, it is possible to use, for example, a silicon nitride film ($SiN_x$), a silicon oxide film ($SiO_x$), a silicon oxynitride film (SiON), or the like.

Furthermore, the channel protecting layer 9 functions as a channel etch-stop (CES) layer for protecting the amorphous silicon film 5 from being etched during the etching when the pair of contact layers 6 is formed by patterning. In other words, the upper part of the channel protecting layer 9 is etched due to the etching during the forming of the contact layers 6.

Furthermore, the channel protecting layer 9 can be configured of an organic material layer made of an organic material containing, as a main component, silicon, oxygen, and carbon, or an inorganic material layer having, as a main component, an inorganic material such as a silicon oxide, a silicon nitride, or the like. It should be noted that the channel protecting layer 9 has insulation properties, and thus the pair of contact layers 6 are not electrically connected.

As described above, as in the thin-film semiconductor device 100 shown in FIG. 1A, in the bottom-gate TFTs shown in FIG. 14A to FIG. 14D, the crystalline silicon film 4 which is to become the channel portion is also configured with the sintered morphology which includes the first crystals 41C having a large crystal grain size, and, due to the first crystals 41C included in the sintered morphology, the grain size of the crystalline silicon film 4 is larger than the grain size of the crystalline silicon film formed using a crystallization annealing process that is the same as that in the conventional method. With this, a TFT having high mobility can be realized. In addition, since the crystalline silicon film 4 is formed by performing film-thinning on a crystalline silicon film having the above-described sintered morphology, it is possible to reduce the number of crystal grain boundaries in a region in the film-thickness direction in the carrier conduction path. With this, electrical characteristic unevenness can be reduced. Therefore, it is possible to realize a bottom-gate TFT that combines the characteristics of high mobility and low electrical characteristic unevenness.

(Bottom-gate TFT Manufacturing Method)

Figure 15:
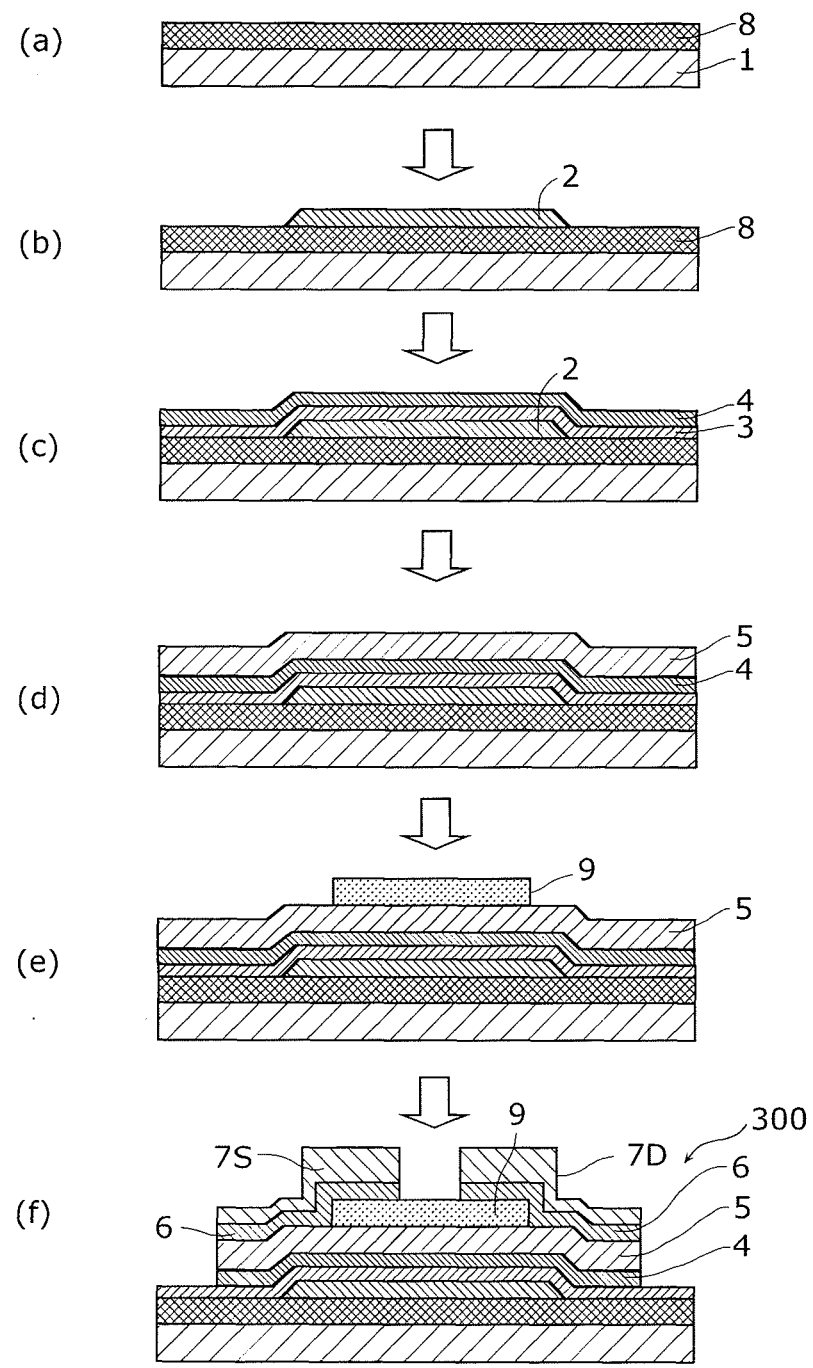
FIG. 15 shows cross-sectional views that schematically illustrate respective processes in a method of manufacturing the second bottom-gate TFT according to the exemplary embodiment.

Next, a method of manufacturing the second bottom-gate TFT 300 according to the exemplary embodiment shall be described with reference to FIG. 15. FIG. 15 shows cross-sectional views that schematically illustrate respective processes in the method of manufacturing the second bottom-gate TFT 300 according to the exemplary embodiment.

First, as shown in (a) in FIG. 15, a glass substrate is prepared as the substrate 1. Next, before forming the gate electrode 2, the undercoat layer 8 made of a silicon nitride film or a silicon oxide film is formed on the substrate 1 by plasma CVD. It should be noted that, by combining the function of suppressing impurities from the glass substrate into a gate insulating film, the undercoat layer 8 need not be formed.

Next, as shown in (b) in FIG. 15, the gate electrode 2 is formed in a predetermined shape on the undercoat 8. For example, the gate electrode 2 having a predetermined shape can be formed by forming a gate metal film made of MoW on the undercoat layer 8 by sputtering, and patterning the gate metal film using a photolithography method or a wet etching method.

Next, as shown in (c) in FIG. 15, the gate insulating film 3 is formed covering the substrate 1 above which the gate electrode 2 has been formed. For example, the gate insulating film 3 made of a silicon oxide is formed by plasma CVD, and so on, so as to cover the gate electrode 2.

Next, as shown in (c) in FIG. 15, an amorphous silicon film is formed, as a precursor of the crystalline silicon film 4, on the gate insulating film 3. The amorphous silicon film can be formed by plasma CVD and so on. Furthermore, the amorphous silicon film is formed consecutively in the same equipment, and, for example, in the same reaction chamber, as the gate insulating film 3. With this, it is possible to reduce impurity contamination in the interface between the gate insulating film 3 and the amorphous silicon film.

Next, as described using (b) to (d) in FIG. 9, the amorphous silicon film is crystallized by annealing the amorphous silicon film at a temperature of 500° C. to 1000° C., to form a crystalline silicon film. In the exemplary embodiment, the crystallization of the amorphous silicon film was performed by annealing for approximately 1 minute to several hours using a rapid thermal annealing method.

It should be noted that, when a glass substrate is used as the substrate 1, it is preferable that annealing be performed at a temperature of 800° C. or lower in order to suppress damage to or distortion of the glass substrate. Furthermore, the grain size of the crystalline silicon film can be controlled by adjusting the annealing temperature and the annealing time. Moreover, although it is possible to use an annealing method (for example, laser annealing, flash lamp annealing, etc.) which rapidly raises the temperature (>100° C./sec.), in this case, in order to prevent film damage due to bumping of hydrogen inside the amorphous silicon film, crystallization annealing is performed, for example, after performing dehydrogenation annealing at a temperature of 400° C. or higher which is the temperature at which hydrogen escapes from the amorphous silicon film.

Next, as shown in (e) in FIG. 9, the crystalline silicon film is thinned by etching. In the exemplary embodiment, the thickness of the crystalline silicon film is reduced (thinned) by immersing the substrate prior to the film-thinning in a dilute hydrofluoric acid solution. Furthermore, in the exemplary embodiment, in order that the crystalline silicon film prior to film-thinning is etched to an even thickness within the substrate surface, silicon oxide of uniform thickness is generated in the upper surface of the crystalline silicon film by way of ozone oxidation, and this silicon oxide is etched using a dilute hydrofluoric acid solution. It should be noted that, in the exemplary embodiment, the thickness of the crystalline silicon film prior to film-thinning is 55 nm, and the thickness of the crystalline silicon film after the film-thinning is 33 nm.

In this manner, the crystalline silicon film 4, which is the crystalline silicon film after the film-thinning, can be formed on the gate insulating film 3 as shown in (c) in FIG. 15.

Next, as shown in (d) in FIG. 15, the amorphous silicon film 5 is formed on the crystalline silicon film 4. The amorphous silicon film 5 can be formed by plasma CVD and so on.

Here, for example, hydrogen plasma processing is performed on the crystalline silicon film 4 before the amorphous silicon film 5 is stacked. With this hydrogen plasma processing, it is possible to obtain the advantageous effects of hydrogenating the crystalline silicon film 4, removing the natural oxide film formed on the crystalline silicon film 4, and improving the adhesion of the amorphous silicon film 5. The hydrogen plasma processing is performed by generating hydrogen plasma using radio frequency (RF) power and a gas including hydrogen gas as a source material, and irradiating the crystalline silicon film 4 with the hydrogen plasma.

It should be noted that, in this hydrogen plasma processing, hydrogen plasma including hydrogen ions ($H^+$) and hydrogen radicals ($H^*$) is generated inside a plasma atmosphere, and through the penetration of the generated hydrogen ions and hydrogen radicals into the crystalline silicon film 4, the dangling bonds of the silicon atoms making up the crystalline silicon film 4 are hydrogen terminated.

Next, as shown in (e) in FIG. 15, the channel protecting layer 9 having a predetermined shape is formed on the amorphous silicon film 5. For example, the channel protecting layer 9 having the predetermined shape can be formed by forming an insulating film made of a silicon oxide film on the amorphous silicon film 5 by CVD, and patterning the insulating film using a photolithography method and a wet etching method. It should be noted that the process can be simplified by using a solution-processable organic material or a photosensitive solution-processable application-type organic material for the channel protecting layer 9.

Next, a contact layer film which is to become the contact layers 6 is formed on the amorphous silicon film 5 so as to cover the channel protecting layer 9. For example, a contact layer film made of amorphous silicon doped with an impurity of a quinquevalent element such as phosphorus, and so on, is formed by plasma CVD. Here, before forming the contact layer film, the natural oxide film formed on the upper surface of the amorphous silicon film 5 is removed by, for example, performing, on the amorphous silicon film 5, dry etching using $CF_4$ or $O_2$ or wet etching using dilute hydrofluoric acid (DHF). In addition, by performing hydrogen plasma processing before forming the contact layer film, it is possible to improve the adhesion with the amorphous silicon film 5 and remove the natural oxide film formed on the upper surface of the amorphous silicon film 5.

Next, a source/drain metal film which is to become the source electrode 7S and the drain electrode 7D is formed on the contact layer film. For example, a source/drain metal film having a trilayer structure of MoW/Al/MoW is formed by sputtering. Subsequently, in order to pattern the source electrode 7S and the drain electrode 7D of the predetermined shape, a resist material is applied onto the source/drain metal film, then exposed, and developed, to form a resist that is patterned in the predetermined shape.

Next, the source electrode 7S and the drain electrode 7D of the predetermined shape are formed, as shown in (f) in FIG. 15, by patterning the source/drain metal film by performing wet etching with the resist as a mask. It should be noted that, at this time, the contact layer film functions as an etching stopper. Subsequently, the resist is removed. With this, the source electrode 7S and the drain electrode 7D can be formed above the channel region of the crystalline silicon film 4.

Next, the contact layer film, the amorphous silicon film 5, and the crystalline silicon film 4 are patterned by performing etching with the source electrode 7S and the drain electrode 7D as a mask. With this, it is possible to form the pair of contact layers 6 of a predetermined shape, and the amorphous silicon film 5 and the crystalline silicon film 4 which are stacked in the shape of an island.

In this manner, it is possible to manufacture the second bottom-gate TFT 300 according to the exemplary embodiment.

As described above, according to the second bottom-gate TFT 300 manufactured in the above-described manner, the crystalline silicon film 4 which is to become the channel part is configured of a sintered morphology which includes the first crystals 41C having a large crystal grain size, and due to the first crystals 41C included in the crystal morphology, the grain size of the crystalline silicon film 4 is larger than the grain size of the crystalline silicon film formed using a crystallization annealing process that is the same as that in the conventional method. With this, a TFT having high mobility can be realized. In addition, since the crystalline silicon film 4 is formed by performing film-thinning on a crystalline silicon film having the above-described sintered morphology, it is possible to reduce the number of crystal grain boundaries in a region in the film-thickness direction in the carrier conduction path. With this, electrical characteristic unevenness can be reduced. Therefore, it is possible to obtain a bottom-gate TFT that combines the characteristics of high mobility and low electrical characteristic unevenness.

It should be noted that, in the first bottom-gate TFT 200 according to the exemplary embodiment shown in FIG. 14A, the channel protecting layer 9 is not formed. As such, in the forming of the contact layers 6, the contact layers 6 can be formed by performing time-controlled etching in such a way that the amorphous silicon film 5 is not completely etched-out.

Furthermore, the third bottom-gate TFT 400 according to the exemplary embodiment shown in FIG. 14C and the fourth bottom-gate TFT 500 according to the exemplary embodiment shown in FIG. 14D can be manufactured by interchanging the sequence in the above described manufacturing method.

(Top-gate TFT Configuration)

Four types are mainly used as top-gate TFTs. Hereinafter, the configurations of four types of top-gate TFTs according to the exemplary embodiment shall be described with reference to FIG. 16A to FIG. 16D.

Figure 16A:
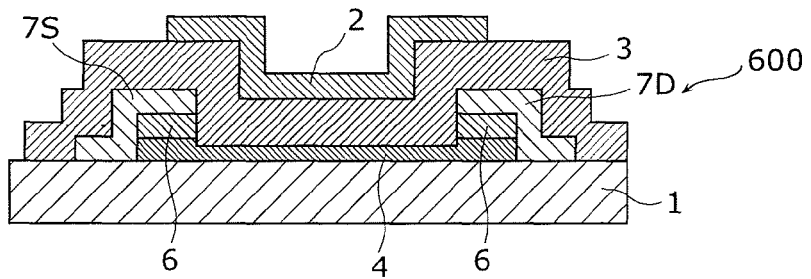
FIG. 16A is a cross-sectional view schematically showing a configuration of a first top-gate TFT according to the exemplary embodiment.

FIG. 16A is a cross-sectional view that schematically shows a configuration of a first top-gate TFT 600 according to the exemplary embodiment. As shown in FIG. 16A, the first top-gate TFT 600 includes: the substrate 1; the crystalline silicon film 4 formed above the substrate 1; the source electrode 7S formed above one end region of the crystalline silicon film 4; the drain electrode 7D formed above the other end region of the crystalline silicon film 4; the pair of contact layers 6 respectively formed between the one end region of the crystalline silicon film 4 and the source electrode 7S and between the other end region of the crystalline silicon film 4 and the drain electrode 7D; the gate insulating film 3 formed on the source electrode 7S, the drain electrode 7D, and the crystalline silicon film 4 in between the source electrode 7S and the drain electrode 7D; and the gate electrode 2 formed on the gate insulating film 3. It should be noted that, the crystalline silicon film 4 is formed according to the method of forming the crystalline silicon film 4 according to the exemplary embodiment, described above.

Figure 16B:
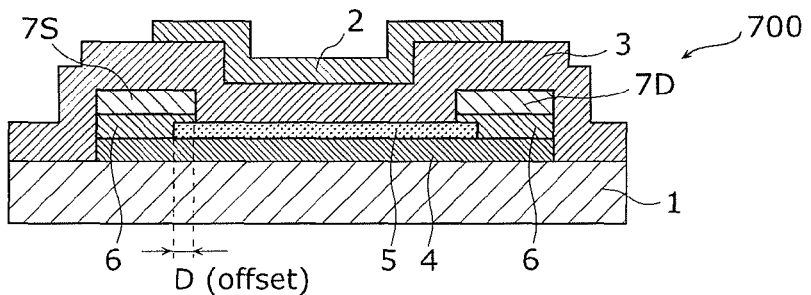
FIG. 16B is a cross-sectional view schematically showing a configuration of a second top-gate TFT according to the exemplary embodiment.

Furthermore, FIG. 16B is a cross-sectional view that schematically shows a configuration of a second top-gate TFT 700 according to the exemplary embodiment. As shown in FIG. 16B, the second top-gate TFT 700 includes, in the same manner as the first top-gate TFT 600 shown in FIG. 16A: the substrate 1; the crystalline silicon film 4, the pair of the contact layers 6, the pair of the source electrode 7S and the drain electrode 7D, the gate insulating film 3, and the gate electrode 2 which are formed above the substrate 1.

In the second top-gate TFT 700, the channel protecting layer 9 is further formed on the crystalline silicon film 4. Both ends of the channel protecting layer 9 are formed so as to be interposed between the source electrode 7S (or the drain electrode 7D) and the crystalline silicon film 4, and part of the source electrode 7S (or the drain electrode 7D) and the channel protecting layer 9 overlap each other in a direction perpendicular to the substrate. The width of the overlap between the source electrode 7S (or the drain electrode 7D) and the channel protecting layer 9 is called offset width D. Each of the regions of the crystalline silicon film 4 corresponding to the offset width D is an offset region to which the gate voltage is not applied. Because the gate voltage is not applied, the offset region becomes a high-resistance region in which a channel region is not formed.

Figure 16C:
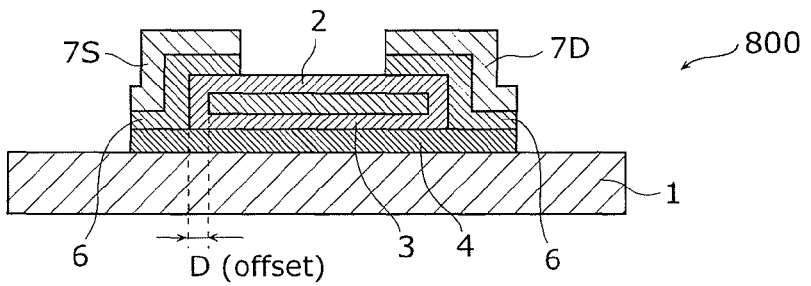
FIG. 16C is a cross-sectional view schematically showing a configuration of a third top-gate TFT according to the exemplary embodiment.

FIG. 16C is a cross-sectional view that schematically shows a configuration of a third top-gate TFT 800 according to the exemplary embodiment. As shown in FIG. 16C, the third top-gate TFT 800 includes: the substrate 1; the crystalline silicon film 4 formed above the substrate 1; and the gate electrode 2 formed above the crystalline silicon film 2 and which is surrounded by the gate insulating film 3. Furthermore, the pair of contact layers 3 is formed on both ends of the crystalline silicon film 4 via the gate insulating film 3, and the source electrode 7S and the drain electrode 7D are formed above the pair of contact layers 3. It should be noted that, in FIG. 16C, the width of the gate insulating film 3 formed at both side parts of the gate electrode 2 is the offset width D. Each of the regions of the crystalline silicon film 4 corresponding to the offset width D is an offset region.

Figure 16D:
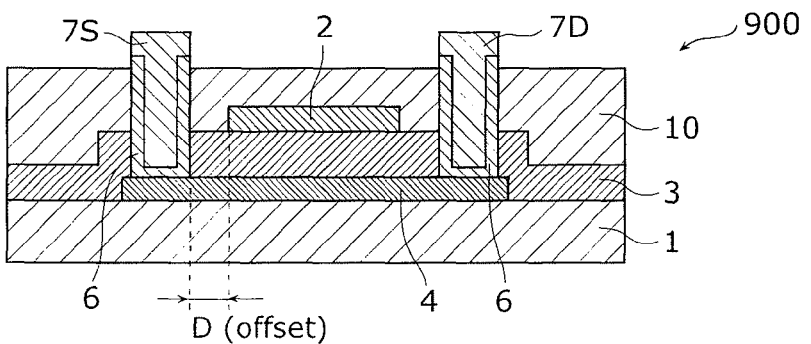
FIG. 16D is a cross-sectional view schematically showing a configuration of a fourth top-gate TFT according to the exemplary embodiment.

FIG. 16D is a cross-sectional view that schematically shows a configuration of a fourth top-gate TFT 900 according to the exemplary embodiment. As shown in FIG. 16D, the fourth top-gate TFT 900 includes: the substrate 1; the crystalline silicon film 4, the gate insulating film 3, and the gate electrode 2 which are formed above the substrate 1; and an insulating layer 10 formed on the gate insulating film 3 and the gate electrode 2. Furthermore, contact holes connected to the crystalline silicon film 4 are formed in the gate insulating film 3 and the insulating layer 10. The source electrode 7S and the drain electrode 7D are formed inside the contact holes and extending above the insulating layer 10, via the contact layers 6 formed inside the contact holes. It should be noted that, in FIG. 16D, the crystalline silicon film 4 between the source electrode 7S and the drain electrode 7D, above which the gate electrode 2 is not formed is the offset region, and the width between one of the contact layers 6 and the gate electrode 2 becomes the offset width D.

As described above, among the four types of top-gate TFTs shown in FIG. 16A to FIG. 16D, the three types of top-gate TFTs of the second top-gate TFT 700, the third top-gate TFT 800, and the fourth top-gate TFT 900 each have a high-resistance region which is the offset region. Therefore, these three types of top-gate TFTs have the disadvantage that carrier mobility decreases and cost becomes high due to the increased number of masks in the manufacturing process.

For example, a TFT to be used in an active-matrix substrate for a display device has high carrier mobility and allows manufacturing with a small number of masks. As such, the first top-gate TFT 600 in which an offset region is not formed is most effective for realizing this.

Although the respective structural elements of the first top-gate TFT 600 according to the exemplary embodiment shown in FIG. 16A shall be described in detail below, description shall center on the points of difference with the thin-film semiconductor device 100 shown in FIG. 1A.

In the same manner as in the thin-film semiconductor device 100, the substrate 1 is, for example, a glass substrate made of a glass material such as quartz glass, alkali-free glass, highly heat-resistant glass, and so on.

The crystalline silicon film 4 is formed in the shape of an island, above the substrate 1. It should be noted that the above-described undercoat layer 8 may be formed between the substrate 1 and crystalline silicon film 4. The crystalline silicon film 4 in the exemplary embodiment is a crystalline silicon film formed by forming the sintered morphology by crystallizing the amorphous silicon film which is the precursor film, then performing film-thinning, in the same manner as the thin-film semiconductor device 100 shown in FIG. 1A.

The upper surface and the side surface of each end of the crystalline silicon film 4 is electrically connected to the corresponding one of the source electrode 7S and the drain electrode 7D via the contact layers 6. It should be noted that, as in the thin-film semiconductor device 100 shown in FIG. 1A, the contact layers 6 are impurity-doped n+ layers.

The source electrode 7S and the drain electrode 7D are in ohmic contact with the contact layers 6, and each is formed on the upper surface of a corresponding one of the contact layers 6. Furthermore, the source electrode 7S and the drain electrode 7D are formed to have level side surfaces with the contact layers 6. It should be noted that, as a material of the source electrode 7S and the drain electrode 7D, it is possible to use the same material as in the thin-film semiconductor device 100 shown in FIG. 1A.

In the same manner as in the thin-film semiconductor device 100 shown in FIG. 1A, the gate insulating film 3 is made of an insulating material such as a silicon oxide film ($SiO_x$), and is formed on the crystalline silicon film 4 that is not covered by the contact layers 6, and on the source electrode 7S and the drain electrode 7D.

The gate electrode 2 is formed on the gate insulating film 3, and is formed at least above the crystalline silicon film 4 that is not covered by the contact layers 6. In other words, the gate electrode 2 is formed above the crystalline silicon film 4 so that the gate insulating film 3 is interposed therebetween. As a material of the gate electrode 2, it is possible to use the same material as in the thin-film semiconductor device 100 shown in FIG. 1A.

As described above, in the same manner as in the thin-film semiconductor device 100 shown in FIG. 1A, in the top-gate TFTs shown in FIG. 16A to FIG. 16D, the crystalline silicon film 4 which is to become the channel portion is also configured with the sintered morphology which includes the first crystals 41C having a large crystal grain size, and, due to the first crystals 41C included in the sintered morphology, the grain size of the crystalline silicon film 4 is larger than the grain size of the crystalline silicon film formed using a crystallization annealing process that is the same as that in the conventional method. With this, a TFT having high mobility can be realized. In addition, since the crystalline silicon film 4 is formed by performing film-thinning on a crystalline silicon film having the above-described sintered morphology, it is possible to reduce the number of crystal grain boundaries in a region in the film-thickness direction in the carrier conduction path. With this, electrical characteristic unevenness can be reduced. Therefore, it is possible to realize a top-gate TFT that combines the characteristics of high mobility and low electrical characteristic unevenness.

(Top-gate TFT Manufacturing Method)

Figure 17:
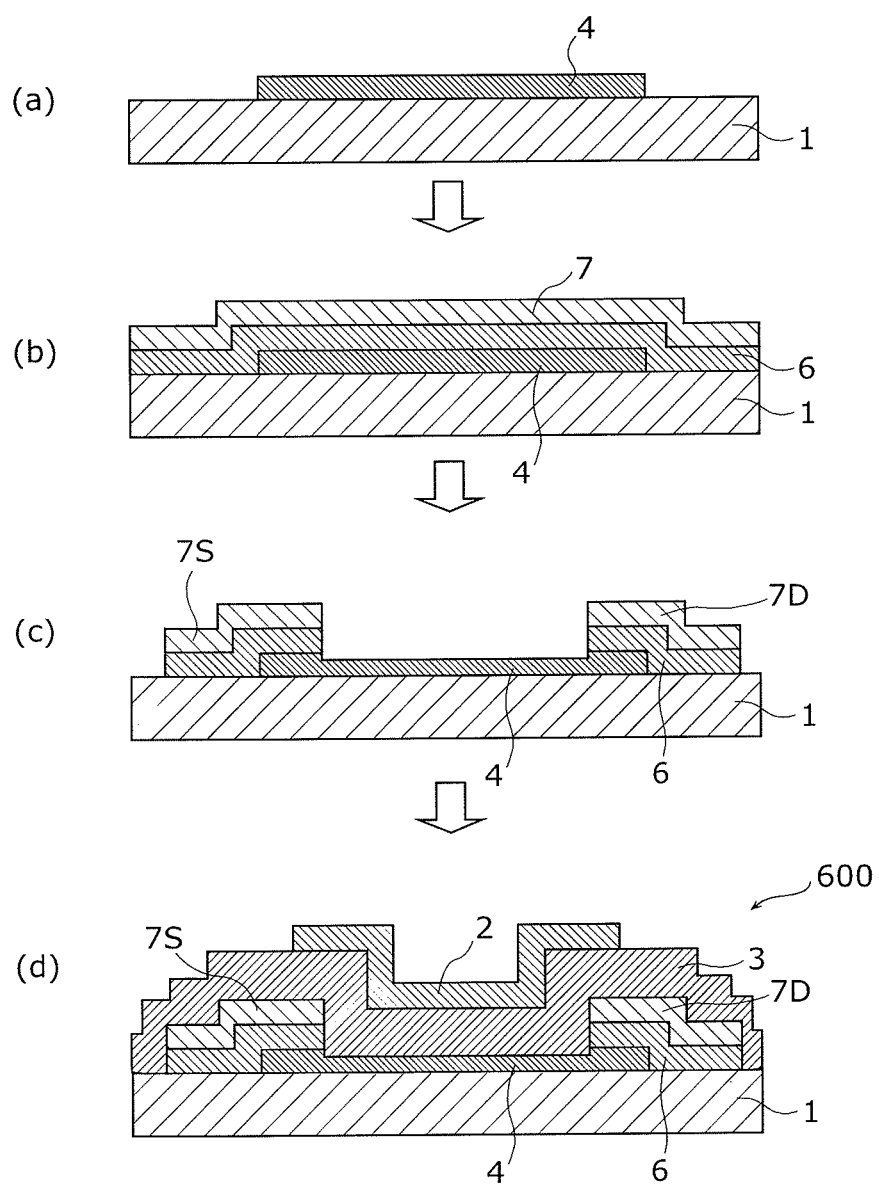
FIG. 17 shows cross-sectional views that schematically illustrate respective processes in a method of manufacturing the first top-gate TFT according to the exemplary embodiment.

Next, a method of manufacturing the first top-gate TFT 600 according to the exemplary embodiment shall be described with reference to FIG. 17. FIG. 17 shows cross-sectional views that schematically illustrate respective processes in a method of manufacturing the first top-gate TFT 600 according to the exemplary embodiment.

First, as shown in (a) in FIG. 17, a glass substrate is prepared as the substrate 1. It should be noted that, before forming the amorphous silicon film which is the precursor film of the crystalline silicon film 4, an undercoat layer made of a silicon nitride film or a silicon oxide film may be formed on the substrate 1 by plasma CVD and so on. It should be noted that, by combining the function of suppressing impurities from the glass substrate into a gate insulating film, the undercoat layer need not be formed.

Next, an amorphous silicon film is formed on the substrate 1, as a precursor film of the crystalline silicon film 4. The amorphous silicon film can be formed by plasma CVD and so on.

Next, in the same manner as in the method described using (b) to (d) in FIG. 9, the amorphous silicon film is crystallized by annealing the amorphous silicon film at a temperature of 500° C. to 1000° C., to form a crystalline silicon film. In the exemplary embodiment, the crystallization of the amorphous silicon film was performed by annealing for approximately 1 minute to several hours using a rapid thermal annealing method.

It should be noted that, when a glass substrate is used as the substrate 1, it is preferable that annealing be performed at a temperature of 800° C. or lower in order to suppress damage to or distortion of the glass substrate. Furthermore, the grain size of the crystalline silicon film can be controlled by adjusting the annealing temperature and the annealing time. Moreover, although it is possible to use an annealing method (for example, laser annealing, flash lamp annealing, etc.) which rapidly raises the temperature (>100° C./sec.), in this case, in order to prevent film damage due to bumping of hydrogen inside the amorphous silicon film, crystallization annealing is, for example, performed after performing dehydrogenation annealing at a temperature of 400° C. or higher which is the temperature at which hydrogen escapes from the amorphous silicon film.

Next, in the same manner as in the method described using (e) in FIG. 9, the crystalline silicon film is thinned by etching. In the exemplary embodiment, the thickness of the crystalline silicon film is reduced (thinned) by immersing the substrate prior to the film-thinning in a dilute hydrofluoric acid solution. Furthermore, in the exemplary embodiment, in order that the crystalline silicon film prior to film-thinning is etched to a uniform thickness within the substrate surface, silicon oxide of uniform thickness is generated in the upper surface of the crystalline silicon film by way of ozone oxidation, and this silicon oxide is etched using a dilute hydrofluoric acid solution. It should be noted that, in the exemplary embodiment, the thickness of the crystalline silicon film prior to film-thinning is 55 nm, and the thickness of the crystalline silicon film after the film-thinning is 33 nm.

Subsequently, as shown in (a) in FIG. 17, the crystalline silicon film 4 is patterned into an island-shape. With this, the crystalline silicon film 2 of a predetermined shape, which is to become the channel portion, can be formed above the substrate 1.

Next, as shown in (b) in FIG. 17, an impurity-doped amorphous silicon film which is to become the contact layers 6 is formed on the upper surface of the substrate 1 and the upper surface of the crystalline silicon film 4, by CVD. For the impurity, for example, a quinquevalent element such as phosphorous can be used.

Next, a source/drain metal film 7 which is to become the source electrode 7S and the drain electrode 7D is formed on the impurity-doped amorphous silicon film. The source/drain metal film 7 can be formed by sputtering, vapor deposition, or CVD. As described earlier, Mo, Cu, Al, and so on, can be used as the material of the source/drain metal film 7.

Next, as shown in (c) in FIG. 17, a resist is formed on the upper surface of the source/drain metal film 7 by applying a predetermined resist material. Subsequently, a mask is placed above the resist. The mask is for patterning the source/drain metal film 7 to form the source electrode 7S and the drain electrode 7D, and is formed corresponding to the source/drain metal film 7 which is to become the source electrode 4 and the drain electrode 7. Specifically, the mask is placed above the resist so as to straddle the boundary region between a predetermined region which is the region on the substrate 1 above which the crystalline silicon film 4 is formed and a region (region other than the predetermined region) on the substrate 1 above which the crystalline silicon film 4 is not formed.

Subsequently, the resist is exposed via the mask, and the exposed resist is removed. With this, the resist in the region other than the region corresponding to the mask is removed and the resist in the regions opposite the mask is left remaining. With this, it is possible to leave the resist only on the regions of the source/drain metal film 7 that are to become the source electrode 7S and the drain electrode 7D. At this time, the source/drain metal film 7 other than the regions which are to become the source electrode 7S and the drain electrode 7D is exposed.

Next, the exposed source/drain metal film 7 is removed by etching using wet etching, with the remaining resist as a mask. This allows the formation of the source electrode 7S and the drain electrode 7D which have a predetermined shape. It should be noted that, for the etching, a compound liquid of phosphoric acid, nitric acid, and acetic acid, and so on, can be used when the source/drain metal film 7 is an aluminum (Al) and copper (Cu) alloy, for example.

Next, by removing, through etching using dry etching, the part of the contact layer 6 that is exposed through the removal of the source/drain metal film 7, the opposing pair of contact layers 6 can be formed.

At this time, the dry etching of the contact layer 6 is performed above the substrate 1 above which the crystalline silicon film 4 is not formed, until the substrate 1 is exposed. In this case, since the thickness of the contact layers 6 on the predetermined region of the substrate 1 (the region on which the crystalline silicon film 4 is formed) and the thickness of the contact layers 6 formed on the regions other than the predetermined region of the substrate 1 (the regions of the substrate 1 on which the crystalline silicon film 4 is not formed) are the same, the crystalline silicon film 4 is also exposed at the same time as the exposure of the substrate 1.

Next, after the resist is removed, the gate insulating film 3 made of silicon dioxide, or the like, is formed by CVD as shown in (d) in FIG. 17.

Subsequently, as shown in (d) in FIG. 17, a metal film which is to become the gate electrode 2 is formed on the gate insulating film 3 by sputtering, and the gate electrode 2 of a predetermined shape is formed by patterning and etching.

In this manner; it is possible to manufacture the first top-gate TFT 600 according to the exemplary embodiment.

According to the first top-gate TFT 600 manufactured in the above-described manner, the crystalline silicon film 4 which is to become the channel portion is configured with the sintered morphology which includes the first crystals 41C having a large crystal grain size, and, due to the first crystals 41C included in the sintered morphology, the grain size of the crystalline silicon film 4 is larger than the grain size of the crystalline silicon film formed using a crystallization annealing process that is the same as that in the conventional method. With this, a TFT having high mobility can be realized. In addition, since the crystalline silicon film 4 is formed by performing film-thinning on a crystalline silicon film having the above-described sintered morphology, it is possible to reduce the number of crystal grain boundaries in a region in the film-thickness direction in the carrier conduction path. With this, electrical characteristic unevenness can be reduced. Therefore, it is possible to obtain a top-gate TFT that combines the characteristics of high mobility and low electrical characteristic unevenness.

It should be noted that the second to fourth top-gate TFTs 700, 800, and 900 shown in FIG. 16B to FIG. 16D can be easily manufactured by interchanging the process sequence or combining existing processes based on the above-described manufacturing methods.

(Organic EL Display Device)

Hereinafter, an example in which the thin-film semiconductor device 100 according to the exemplary embodiment is applied to a display device shall be described with reference to FIG. 18 and FIG. 19. It should be noted that, in the exemplary embodiment, an example of an application to an organic EL display device shall be described.

Figure 18:
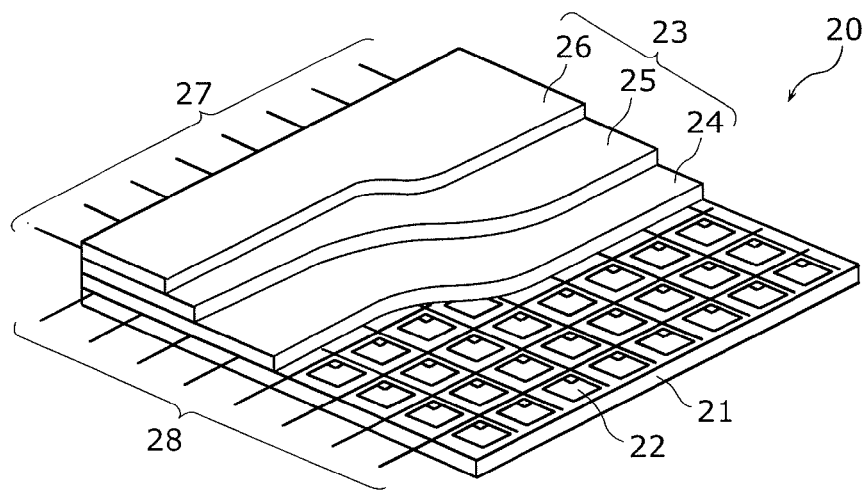
FIG. 18 is a partial cutout perspective view of an organic EL display device in the exemplary embodiment.

FIG. 18 is a partial cutout perspective view of an organic EL display device according to the exemplary embodiment. The thin-film semiconductor device 100 configured in the above-described manner can be used as a switching transistor or a driving transistor in an active-matrix substrate of the organic EL display device, and is used as a driving transistor in the exemplary embodiment.

As shown in FIG. 18, an organic EL display device 20 includes: an active-matrix substrate (TFT array substrate) 21; pixels 22 arranged in a matrix on the active-matrix substrate 21; organic EL elements 23 that are formed to correspond to the respective pixels 22; scanning lines (gate lines) 27 formed along the row direction of the pixels 22; video signal lines (source lines) 28 formed along the column direction of the pixels 22; and power source lines 29 (not shown in the figure) formed parallel to the video signal lines 28. Each of the organic EL elements 23 includes an anode electrode 24, an organic EL layer 25, and a cathode electrode 26 which are sequentially stacked above the active-matrix substrate 21. It should be noted that, in actuality, plural anode electrodes 24 are formed for each pixel 22. Furthermore, a plurality of the organic EL layers 25 is formed to correspond with the respective pixels 22, and each of the organic EL layers 25 is configured by stacking the respective layers of an electron transport layer, a light-emitting layer, a hole transport layer, and so on.

Next, a circuit configuration of each of the pixels 22 in the organic EL display device 20 shall be described with reference to FIG. 19. FIG. 19 is a diagram showing a circuit configuration of a pixel using the thin-film semiconductor device according to the exemplary embodiment.

Figure 19:
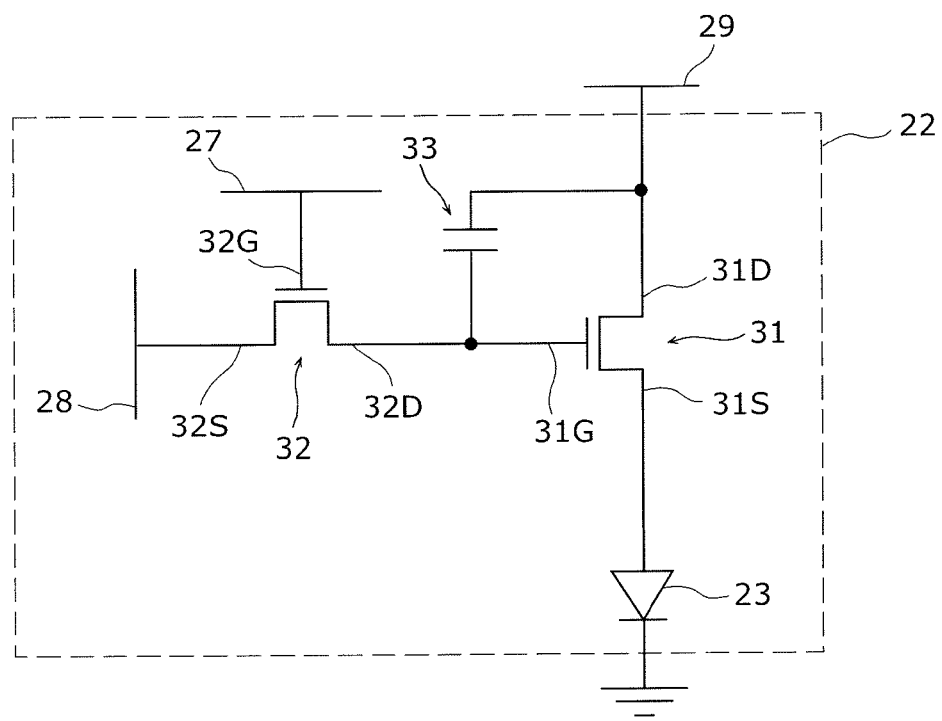
FIG. 19 is a diagram showing a circuit configuration of a pixel using the thin-film semiconductor device according to the exemplary embodiment.

As shown in FIG. 19, the respective pixels 22 are partitioned by the scanning lines 27 and the video signal lines 28 which cross each other, and include a driving transistor 31, a switching transistor 32, a capacitor 33, and the organic EL element 23. The driving transistor 31 is a transistor for driving the organic EL element 23, and the switching transistor 32 is a transistor for selecting the pixel 22.

In the driving transistor 31, a gate electrode 31G is connected to a drain electrode 32D of the switching transistor 32, a source electrode 31S is connected to the anode of the organic EL element 23 via a relay electrode (not-shown in the figure), and a drain electrode 31D is connected to the power source line 29.

Furthermore, in the switching transistor 32, a gate electrode 32G is connected to the scanning line 27, a source electrode 32S is connected to the video signal line 28, and a drain electrode 32D is connected to the capacitor 33 and the gate electrode 31G of the driving transistor 31.

In this configuration, when a gate signal is input to the scanning line 27 and the switching transistor 32 turns ON, the video signal voltage supplied via the video signal line 28 is written into the capacitor 33. The video signal voltage (held voltage) that is written into the capacitor 33 is held throughout 1 frame period, and this held video signal voltage causes analog change in conductance of the driving transistor 31, so that drive current corresponding to luminescence gradation flows from the anode to the cathode of the organic EL element 23, and thus the organic EL element 23 emits light.

It should be noted that although the organic EL display device using the organic EL element was described in the exemplary embodiment, the present disclosure is not limited to such. For example, application to a display device including another display device in which an active-matrix substrate is used, such as a liquid crystal display device, and so on. Furthermore, the above-described display device according to the exemplary embodiment can be used as a flat panel display, and can be applied to various electronic devices having a display unit, such as a television set, a personal computer, a cellular phone, and so on.

(Working Example)

Next, a thin-film semiconductor device according to a working example shall be described. In this working example, TFTs of three types of configurations are manufactured, and their electrical characteristics were measured. The TFTs of the three types of configurations are a conventional thin-film semiconductor 1000 (hereafter referred to as the "conventional example TFT"), a thin-film semiconductor device 100A according to a comparative example (hereafter referred to as the "comparative example TFT"), and the thin-film semiconductor device according to the working example of the present disclosure (hereafter referred to as the "working example TFT").

Figure 20A:
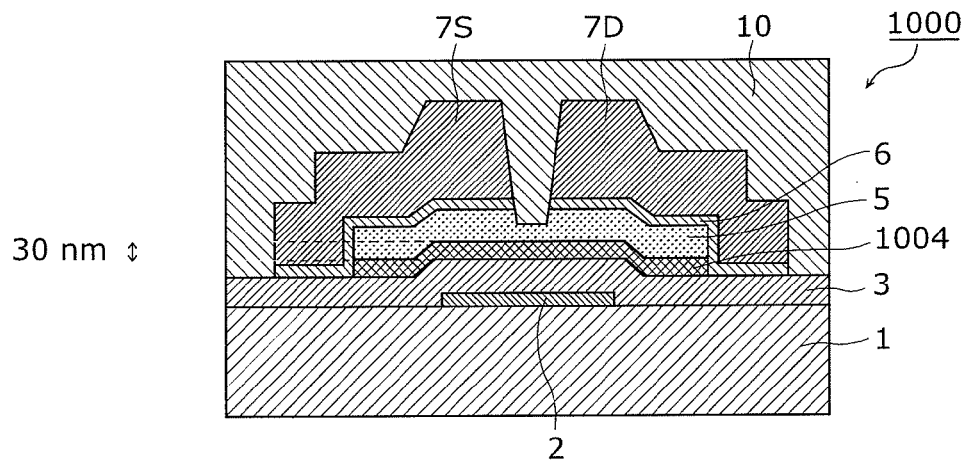
FIG. 20A is cross-sectional view schematically showing a configuration of TFT according to a conventional example.
Figure 20B:
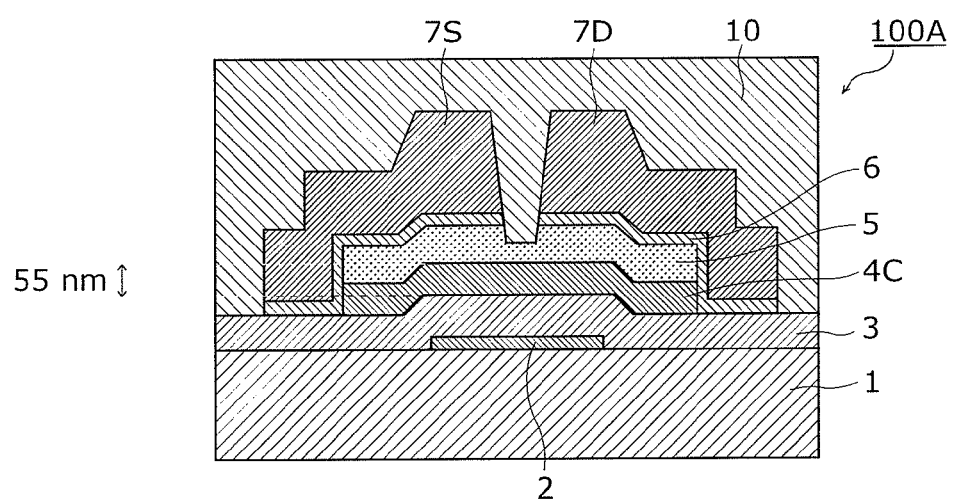
FIG. 20B is a cross-sectional view schematically showing a configuration of a TFT according to a comparative example.
Figure 20C:
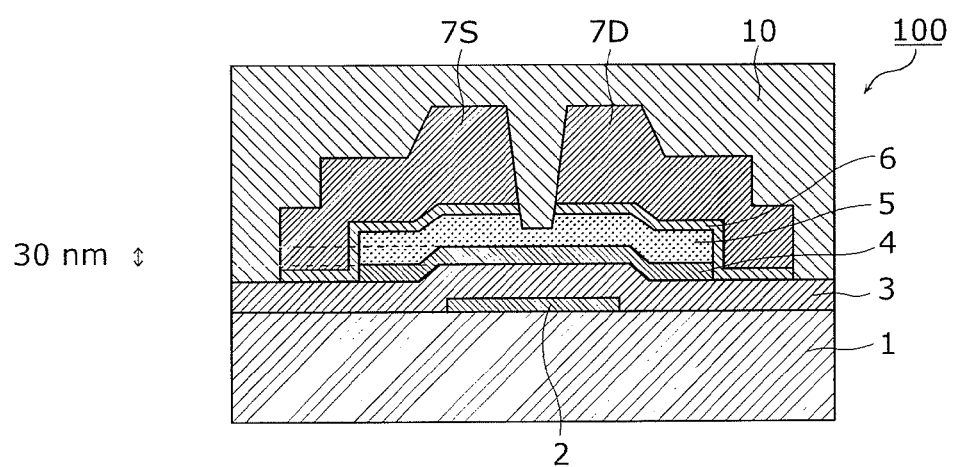
FIG. 20C is a cross-sectional view schematically showing a configuration of a TFT according to a working example.

FIG. 20A, FIG. 20B, and FIG. 20C are cross-sectional views that schematically show the configuration of the conventional example TFT, the comparative example TFT, and the working example TFT, respectively. As shown in FIG. 20A to FIG. 20C, each of the conventional example TFT, the comparative example TFT, and the working example TFT is a bottom-gate thin-film transistor and includes: the gate electrode 2, the gate insulating film 3, the crystalline silicon film 4, the amorphous silicon film 5, the pair of contact layers 6, the pair of the source electrode 7S and the drain electrode 7D, and the insulating layer (passivation film) 10 which are sequentially stacked above the substrate 1.

In the respective TFTs of the conventional example, the comparative example, and the working example, the gate electrode 2 is formed from MoW with a thickness of 50 nm by sputtering. Furthermore, the gate insulating film 3 is formed from a silicon oxide film with a thickness of 120 nm by plasma CVD. Furthermore, the amorphous silicon film 5 is formed by plasma CVD, with thickness set to 75 nm. It should be noted that, as film-forming conditions of the amorphous silicon film 5, film-forming temperature is set to 320° C., growth pressure is set to 2 Torr, the source gas is silane ($SiH_4$) and its flow rate is set to 10 sccm, the inert gas is hydrogen and its flow rate is set to 60 sccm. Furthermore, for the contact layers 6, an $n^+$ silicon film is formed by plasma CVD, with thickness set to 10 nm. Furthermore, for the source electrode 7S and the drain electrode 7D, Al is deposited with a thickness of 500 nm by sputtering. It should be noted that, for the insulating layer 10, a silicon nitride (SiN) film is formed by plasma CVD, with thickness set to 10 nm.

Furthermore, the configuration of the silicon semiconductor film which is to become the channel portion is different among the conventional example TFT, the comparative example TFT, and the working example TFT. In the conventional example TFT shown in FIG. 20A, which is a conventional TFT, the channel portion is a crystalline silicon film 1004 which has a thickness of 30 nm and is made of crystal grains of a single grain size, and the sintered morphology is not formed. Furthermore, in the comparative example TFT shown in FIG. 20B, which is a TFT serving as a comparative example, the channel portion is the crystalline silicon film 4C in the exemplary embodiment shown in (d) in FIG. 9, and the thickness of the crystalline silicon film 4C is 55 nm. Specifically, although the sintered morphology is formed in the crystalline silicon film 4C which is to become the channel portion in the comparative example, the crystalline silicon film 4C is not etched, and is thus not made into a thin film. Furthermore, in the working example TFT shown in FIG. 20C, which is a TFT in the exemplary embodiment shown in FIG. 1A, the channel portion is the crystalline silicon film 4 in which the sintered morphology is formed, and the thickness of the crystalline silicon film 4 is 30 nm. In addition, the crystalline silicon film 4 in the working example TFT is formed by uniformly thinning the crystalline silicon film 4C using dilute hydrofluoric acid.

Figure 21A:
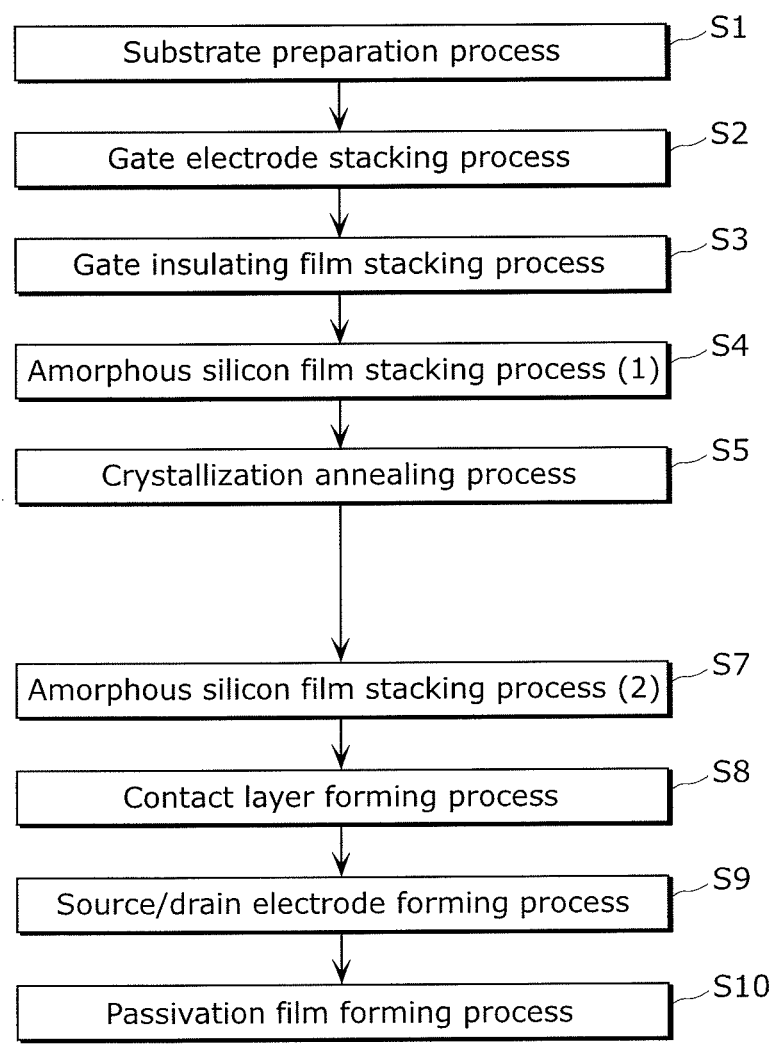
FIG. 21A is a flowchart showing processes in manufacturing the respective TFTs according to the conventional example and the comparative example.
Figure 21B:
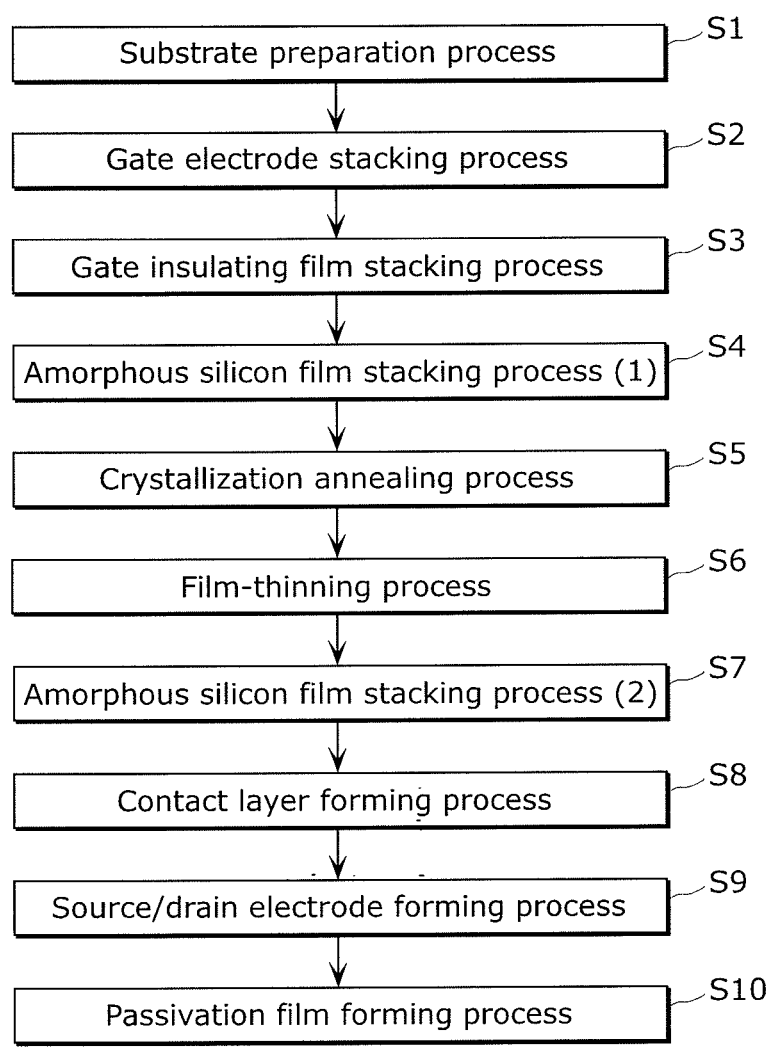
FIG. 21B is a flowchart showing processes in manufacturing the TFT according to the working example.

Furthermore, FIG. 21A is a flowchart showing a manufacturing process for the conventional example TFT and the comparative example TFT, and FIG. 21B is a flowchart showing a manufacturing process for the working example TFT. In the manufacturing processes for the conventional example TFT, the comparative example TFT, and the working example TFT, an amorphous silicon film stacking process (1) (S4), and a film-thinning process (S6) are different.

In the conventional example TFT, an amorphous silicon film having a thickness of 30 nm is formed (S4), and then crystallization thermal annealing is performed to form a crystalline silicon film (S5). It should be noted that, in the conventional example TFT, etching is not performed, and thus film-thinning of the crystalline silicon film is not performed. The amorphous silicon film which is the precursor film of the crystalline silicon film is formed using plasma CVD, and, for the film-forming conditions thereof: film-forming temperature is set to 400° C., growth pressure is set to 2 Torr, the source gas is silane ($SiH_4$) and its flow rate is set to 30 sccm, while inert gas is not used.

Furthermore, in the comparative example TFT, an amorphous silicon film having a thickness of 55 nm is formed (S4), and then crystallization thermal annealing is performed to form a crystalline silicon film (S5). The amorphous silicon film which is the precursor film of the crystalline silicon film is formed under the same film-forming conditions as those for the conventional example. Furthermore, crystallization thermal annealing is performed under conditions in which the sintered morphology is formed. Specifically, thermal annealing at 800° C. is performed for 20 minutes inside a heat-treating furnace that is kept under a nitrogen atmosphere. It should be noted that, in the comparative example TFT, etching is not performed, and thus film-thinning of the crystalline silicon film is not performed.

Furthermore, in the working example TFT, an amorphous silicon film having a thickness of 55 nm is formed (S4), and then crystallization thermal annealing is performed to form a crystalline silicon film (S5). The amorphous silicon film which is the precursor film of the crystalline silicon film is formed under the same film-forming conditions as those for the comparative example TFT. Furthermore, crystallization thermal annealing is performed under conditions in which the sintered morphology is formed. Specifically, thermal annealing at 800° C. is performed for 20 minutes inside a heat-treating furnace that is kept under a nitrogen atmosphere. Subsequently, in the working example, film-thinning of the crystalline silicon film is carried out by performing etching (S6). The etching is performed until the thickness of the crystalline silicon film becomes the desired 30 nm, by performing successive processes of ozone-oxidizing the upper surface of the crystalline silicon film and then immersing the entire substrate after crystallization annealing in dilute hydrofluoric acid.

Figure 22A:
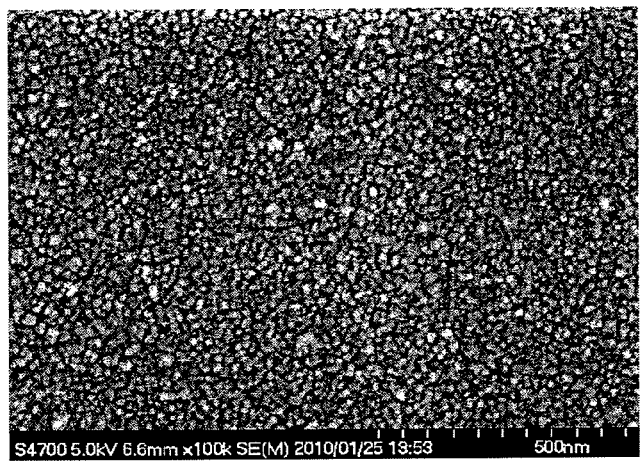
FIG. 22A is a planar SEM image of a crystalline silicon film in the TFT according to the conventional example.
Figure 22B:
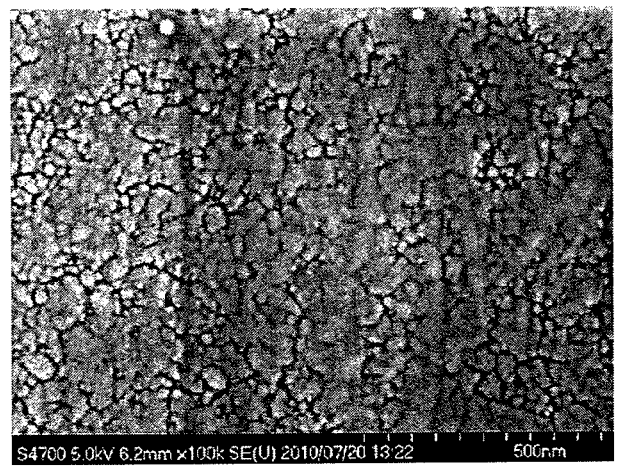
FIG. 22B is a planar SEM image for crystalline silicon films in the respective TFTs according to the comparative example and the working example.

FIG. 22A shows a planar SEM image of the crystalline silicon film 1004 in the conventional example TFT, and FIG. 22B is a planar SEM image of the crystalline silicon: film 4C in the comparative example TFT and the crystalline silicon film 4 in the working example TFT.

As shown in FIG. 22A, it can be seen that a crystal morphology which has a uniform crystal grain size in which the average crystal grain size is approximately 30 nm, is formed in the conventional example TFT. Furthermore, as shown in FIG. 22B, it can be seen that a crystal morphology including a sintered morphology formed by the fusion of crystal grains is formed in the comparative example TFT and the working example TFT.

Figure 23A:
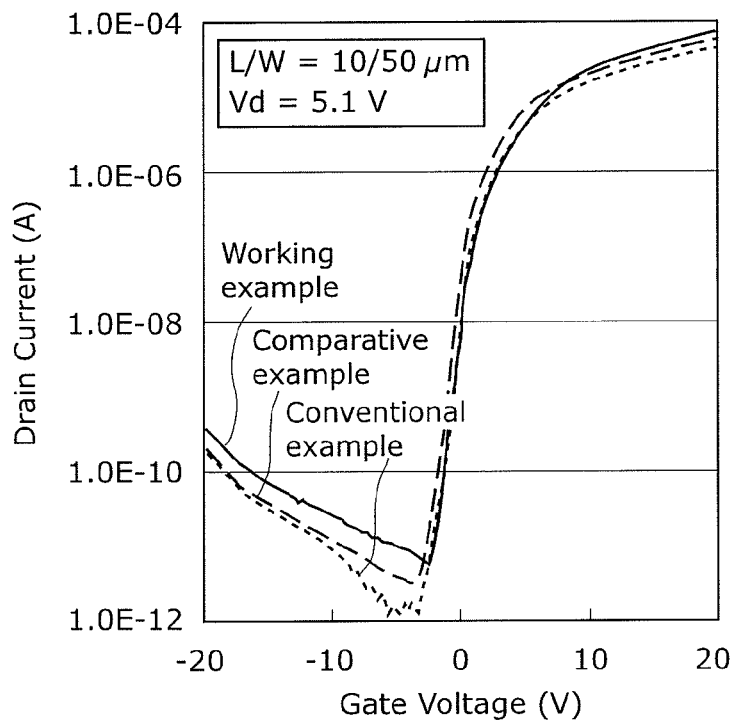
FIG. 23A is a graph showing transmission characteristics of respective bottom-gate TFTs according to the conventional example, the comparative example, and the working example.
Figure 23B:
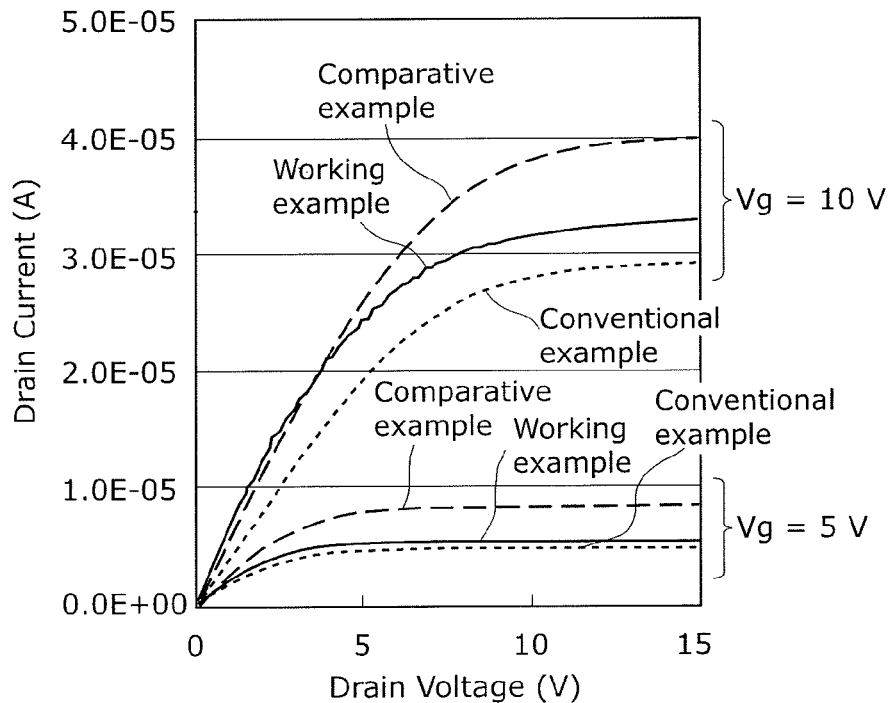
FIG. 23B is a graph showing the drain current-drain voltage electrical characteristics of the respective bottom-gate TFTs according to the conventional example, the comparative example, and the working example.
Figure 24A:
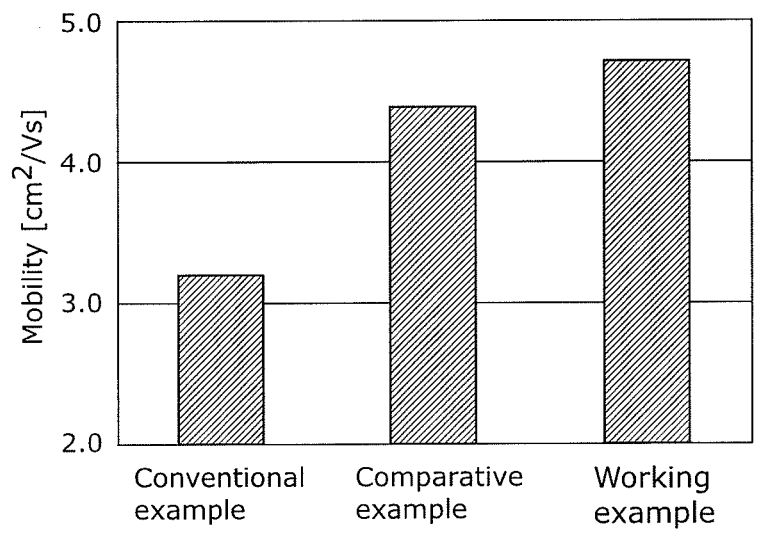
FIG. 24A is a graph showing mobility in the respective bottom-gate TFTs according to the conventional example, the comparative example, and the working example.
Figure 24B:
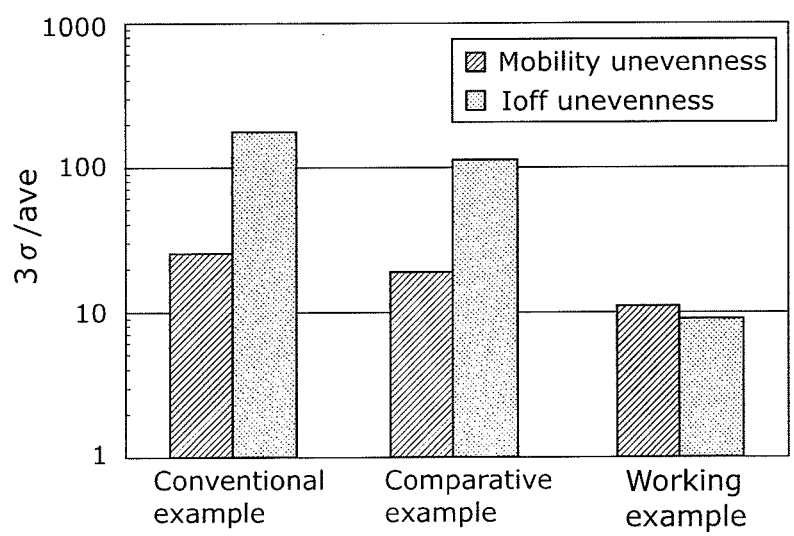
FIG. 24B is a graph showing the electrical characteristic unevenness of the respective TFTs according to the conventional example, the comparative example, and the working example.

Next, the measurement results for the electrical characteristics of the respective TFTs in the conventional example, the comparative example, and the working example, shall be described using FIG. 23A, FIG. 23B, FIG. 24A, and FIG. 24B. FIG. 23A is a graph showing the transmission characteristics of the respective TFTs in the conventional example, the comparative example, and the working example (where drain voltage=5.1 V). FIG. 23B is a graph showing the drain current-drain voltage electrical characteristics of the respective TFTs in the conventional example, the comparative example, and the working example (where gate voltage=5 V, and 10V). FIG. 24A is a graph showing the electrical field effect mobility (hereafter denoted as "mobility") of the respective TFTs in the conventional example, the comparative example, and the working example. FIG. 24B is a graph showing the electrical characteristic unevenness of the respective TFTs in the conventional example, the comparative example, and the working example. It should be noted that for the electrical characteristic unevenness, mobility unevenness (β) which is the unevenness in on-characteristics, and Ioff (off-current) unevenness which is the unevenness in off-characteristics are shown.

First, the measurement results for the transmission characteristics in FIG. 23A shall be described. As shown in FIG. 23A, it can be seen that, for on-current, relatively larger values are shown for the comparative example and working example TFTs than for the conventional example TFT. This is because, in the comparative example and working example TFTs, a sintered morphology such as that shown in FIG. 22B is formed in the crystalline silicon film, and thus mobility increases as described later. In contrast, in the conventional example TFT, a sintered morphology is not formed in the crystalline silicon film and there is a crystal morphology having a uniform crystal grain size in which the average crystal grain size is 30 nm as shown in FIG. 22A, and thus mobility decreases.

Next, as shown in FIG. 23A, it can be seen that, for the off-current, relatively large values are shown in an ascending order of the conventional example, the comparative example, and the working example. In this manner, the off-current is relatively larger for the comparative example and working example TFTs than for the conventional example TFT because the respective TFTs in the comparative example and the working example have a higher mobility than the conventional example TFT.

In this manner, the off-current is relatively larger for the comparative example and working example TFTs than for the conventional example TFT because the respective TFTs in the comparative example and the working example have a higher mobility than the conventional example TFT. However, it is inferred that a reverse tendency is shown as in FIG. 23A because, in the working example TFT, etching damage is inflicted on the upper surface of the crystalline silicon film 4 during the film-thinning process in the manufacturing process, and thus surface crystal defects, which cause off-current to increase, increased.

Next, the graph showing the drain current-drain voltage electrical characteristics in FIG. 23B shall be described. To describe in terms of the high voltages (gate voltage Vg=10 V) the application of which causes a noticeable difference among the conventional example, comparative example, and working example TFTs, the saturation drain current for the gate voltage shows large values in an ascending order of the conventional example, the comparative example, and the working example. In this manner, the saturation current is larger in the comparative example and working example TFTs than in the conventional example TFT because, as described later, the mobility of the comparative example and working example TFTs is higher than the mobility of the conventional example TFT. Furthermore, the comparative example TFT has a larger saturation drain current than the working example TFT because the volume of the depletion layer in the crystalline silicon film 4C of the comparative example TFT during application of a 10 V gate voltage is smaller than the volume of the depletion layer in the crystalline silicon film 4 of the working example TFT since the thickness (55 nm) of the crystalline silicon film 4C of the comparative example TFT is greater than the thickness (30 nm) of the crystalline silicon film 4 of the working example TFT.

Next, the measurement results for the mobility of the respective TFTs in the conventional example, the comparative example, and the working example, shall be described using FIG. 24A. FIG. 24A is a graph showing the characteristics of mobility for the respective TFTs in the conventional example, the comparative example, and the working example.

As shown in FIG. 24A, the mobility of the conventional example TFT is 3.18 $cm^2/Vs$, the mobility of the comparative example TFT is 4.41 $cm^2/Vs$, and the mobility of the working example TFT is 4.73 $cm^2/Vs$.

The results shown in FIG. 24A reveal that the comparative example TFT has a higher mobility than the conventional example TFT. This is because the crystalline silicon film 4C in the comparative example TFT includes the first crystals 41C having the sintered morphology having a large crystal grain size.

In addition, it is also realized that the working example TFT in which etching has been performed also has higher mobility than the conventional example TFT, and has about the same degree of mobility as the comparative example TFT. This is because the first crystals 41C having the sintered morphology having a large crystal grain size are also formed in the crystalline silicon film 4 of the working example TFT. Furthermore, it is presumed that the working example TFT has a slightly higher mobility than the comparative example TFT because the crystalline silicon film 4 of the working example TFT is thinner, and thus the bulk resistance in the thickness direction of the crystalline silicon film 4 is reduced.

Next, the electrical characteristic unevenness in the respective TFTs in the conventional example, the comparative example, and the working example, shall be described using FIG. 24B. FIG. 24B is a graph showing the electrical characteristic unevenness of the respective TFTs in the conventional example, the comparative example, and the working example.

As shown in FIG. 24B, the mobility unevenness (β) of the conventional example TFT is 25.3 in terms of 3σ/ave, the mobility unevenness (β) of the comparative example TFT is 18.3 in terms of 3σ/ave, and the mobility unevenness (β) of the working example TFT is 10.9 in terms of 3σ/ave.

Furthermore, the Ioff unevenness of the conventional example TFT is 181.2 in terms of 3σ/ave, the Ioff unevenness of the comparative example TFT is 111.9 in terms of 3σ/ave, and the Ioff unevenness of the working example TFT is 9.00 in terms of 3σ/ave.

As shown in FIG. 24B, the mobility unevenness and the Ioff unevenness of the working example TFT are reduced further than those of either the conventional example TFT or the comparative example TFT. This is presumed to be because, in the working example TFT, the crystalline silicon film 4 is formed by thinning the crystalline silicon film 4C formed with the sintered morphology, and thus the number of crystal grain boundaries in the regions in the thickness direction in the carrier conduction path decreases.

As described above, by adopting the configuration of the working example TFT, it is possible to realize a TFT that combines the characteristics of high mobility and low electrical characteristic unevenness.

It should be noted that, although a bottom-gate TFT is described as one working example in the this working example, the results for this working example can also be applied to a top-gate TFT, and, even with a top-gate TFT, it is possible to realize a TFT that combines the characteristics of high mobility and low electrical characteristic unevenness in the same manner as with a bottom-gate TFT.

The thin-film semiconductor device and the method of manufacturing the thin-film semiconductor device, and so on, according to an aspect of the present disclosure have been described up to this point based on the exemplary embodiment, the present disclosure is not limited to the above-described exemplary embodiment.

For example, although a silicon thin film is used in the above-described exemplary embodiment, a semiconductor thin film other than a silicon thin film can be used. For example, a crystalline film can also be formed by crystallizing a semiconductor thin film made of germanium (Ge) or SiGe.

Furthermore, in the foregoing exemplary embodiment, the crystalline silicon film may either be an n-type semiconductor or a p-type semiconductor.

Moreover, embodiments obtained through various modifications to the exemplary embodiment which may be conceived by a person skilled in the art as well as embodiments realized by arbitrarily combining the structural elements and functions of the exemplary embodiment without materially departing from the principles and spirit of the present disclosure are included in the present disclosure.

The herein disclosed subject matter is to be considered descriptive and illustrative only, and the appended Claims are of a scope intended to cover and encompass not only the particular embodiment disclosed, but also equivalent structures, methods, and/or uses.

Industrial Applicability

The present disclosure is useful as a thin-film semiconductor device and a method of manufacturing the same, and is most suitable as a thin-film transistor having superior mobility and electrical characteristics and a method of manufacturing the same. Therefore, the present disclosure is suited to a thin-film transistor, or the like, that is used in a thin-screen display device such as a liquid crystal display device or an organic EL display device. In particular, when used in a large-sized liquid crystal display device or organic EL display device having a large image display region with a large number of pixels, the present disclosure can realize a display device which combines characteristics such as superior display properties such as image brightness and gradation as well as low display unevenness.

The invention claimed is:

1. A thin-film semiconductor device manufacturing method comprising:
   preparing a substrate;
   forming a gate electrode above the substrate;
   forming a gate insulating film above the substrate;
   forming an amorphous film above the substrate;
   forming a crystalline film including a first crystal and a second crystal, by crystallizing the amorphous film, the first crystal (i) containing subgrains formed with different crystal orientations in a single crystal and (ii) including a subgrain boundary formed by plural crystal planes between the subgrains, the second crystal having an average crystal grain size smaller than an average crystal grain size of the first crystal;
   thinning the crystalline film; and
   forming a source electrode and a drain electrode above the substrate.

2. The thin-film semiconductor device manufacturing method according to claim 1, wherein the amorphous film is an amorphous silicon film.

3. The thin-film semiconductor device manufacturing method according to claim 2, wherein the amorphous silicon film has a photoluminescence (PL) intensity greater than or equal to 0.65 when photon energy is 1.1 eV in a PL spectrum normalized to have a maximum PL intensity of 1.

4. The thin-film semiconductor device manufacturing method according to claim 1, wherein in the forming of the crystalline film, the amorphous film is crystallized by thermal annealing.

5. The thin-film semiconductor device manufacturing method according to claim 4, wherein the thermal annealing is performed with a thermal annealing temperature ranging from 700° C. to 800° C. and a thermal annealing time ranging from 1 minute to 30 minutes.

6. The thin-film semiconductor device manufacturing method according to claim 1, wherein in the thinning, the crystalline film is thinned by etching.

7. The thin-film semiconductor device manufacturing method according to claim 6, wherein the etching is hydrofluoric acid etching.

8. The thin-film semiconductor device manufacturing method according to claim 6, further comprising
   oxidizing an upper surface of the crystalline film before the thinning,
   wherein in the thinning, an oxidized upper portion of the crystalline film is removed by the etching.

9. The thin-film semiconductor device manufacturing method according to claim 8, wherein the oxidizing is performed by ozone oxidation.

10. The thin-film semiconductor device manufacturing method according to claim 1, wherein the crystalline film before the thinning has a thickness of at least 55 nm, and the crystalline film after the thinning has a thickness ranging from 20 nm to 50 nm.

11. The thin-film semiconductor device manufacturing method according to claim 1,
    wherein the first crystal consists of a crystal grain having an average crystal grain size ranging from 200 nm to 2 µm, and
    the second crystal consists of a crystal grain having an average crystal grain size ranging from 20 nm to 50 nm.

12. The thin-film semiconductor device manufacturing method according to claim 1, wherein the first crystal is a sintered crystal.

13. The thin-film semiconductor device manufacturing method according to claim 1, wherein the first crystal is formed by sintering of the second crystal.

14. The thin-film semiconductor device manufacturing method according to claim 1, wherein the first crystal comprises a region that is surrounded by a different crystal having a different crystal orientation inside a grain having a large grain size.

15. The thin-film semiconductor device manufacturing method according to claim 1, wherein the first crystal has a mixed crystal morphology comprising two types of crystal morphologies having different generation mechanisms.

16. A thin-film semiconductor device comprising:
    a substrate;
    a gate electrode above the substrate;
    a crystalline film above the substrate;
    a gate insulating film between the gate electrode and the crystalline film;
    a source electrode and a drain electrode which are above the substrate, wherein the crystalline film includes a first crystal and a second crystal, the first crystal has an average crystal size ranging from 200 nm to 2 μm, contains subgrains formed with different crystal orientations in a single crystal, and includes a subgrain boundary formed by plural crystal planes between the subgrains, the second crystal has an average crystal grain size that is smaller than the average crystal grain size of the first crystal and ranges from 20 nm to 50 nm, and a percentage of the first crystal in an upper surface of the crystalline film is higher than a percentage of the first crystal in a lower surface of the crystalline film.

17. The thin-film semiconductor device according to claim 16, wherein the second crystal is a single-grained structure.

18. The thin-film semiconductor device according to claim 16, wherein the crystalline film is formed by thinning a precursor film which includes the first crystal and the second crystal.

19. The thin-film semiconductor device according to claim 18, wherein the precursor film has a thickness of at least 55 nm, and the crystalline film has a thickness ranging from 20 nm to 50 nm.

20. The thin-film semiconductor device according to claim 16, wherein a percentage content of the first crystal included in the crystalline film is higher towards the source electrode and the drain electrode than towards the gate insulating film, in a thickness direction of the crystalline film.

21. The thin-film semiconductor device according to claim 16, wherein the thin-film semiconductor device is of a top-gate type.

* * * * *